United States Patent
Lung

(10) Patent No.: US 10,601,342 B2
(45) Date of Patent: Mar. 24, 2020

(54) POWER CONVERSION DEVICE

(71) Applicant: TDK CORPORATION, Tokyo (JP)

(72) Inventor: Chienru Lung, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/363,102

(22) Filed: Mar. 25, 2019

(65) Prior Publication Data

US 2019/0305695 A1    Oct. 3, 2019

(30) Foreign Application Priority Data

Mar. 28, 2018    (JP) ................................. 2018-062907

(51) Int. Cl.
| | | |
|---|---|---|
| H02M 7/5387 | (2007.01) | |
| H02M 1/08 | (2006.01) | |
| H03H 7/06 | (2006.01) | |
| H02J 9/06 | (2006.01) | |

(52) U.S. Cl.
CPC ......... H02M 7/53873 (2013.01); H02M 1/08 (2013.01); *H02J 9/062* (2013.01); *H03H 7/06* (2013.01)

(58) Field of Classification Search
CPC ...... H02M 2001/123; H02J 9/02; H02J 9/062; H02J 2009/068
See application file for complete search history.

(56) References Cited

U.S. PATENT DOCUMENTS

| | | | | |
|---|---|---|---|---|
| 9,520,711 B1* | 12/2016 | Xiong | ................... | H02M 7/538 |
| 2014/0104907 A1* | 4/2014 | Shimada | ............... | H02M 7/487 |
| | | | | 363/80 |
| 2016/0218638 A1* | 7/2016 | Epps | ....................... | H02M 1/38 |

FOREIGN PATENT DOCUMENTS

| | | |
|---|---|---|
| JP | 2015-2657 A | 1/2015 |
| JP | 2015-27197 A | 2/2015 |
| JP | 2015-231259 A | 12/2015 |

* cited by examiner

*Primary Examiner* — Harry R Behm
(74) *Attorney, Agent, or Firm* — Oliff PLC

(57) ABSTRACT

A power conversion device according to an embodiment of the disclosure includes: first paired switching elements including first and second elements coupling, respectively, a first voltage line to a first node and a second voltage line to the first node, second paired switching elements including third and fourth elements coupling, respectively, the first voltage line to a second node and the second voltage line to the second node, third paired switching elements including fifth and sixth elements coupling, respectively, the first voltage line to a third node and the second voltage line to the third node; first and second low-pass filters provided, respectively, in a first path between the first node and a first output terminal and a second path between the second node and a second output terminal; and a control section selectively bringing one of the first and second paired switching elements into an OFF state.

20 Claims, 14 Drawing Sheets

| OPERATING MODE | CONTROL SCHEME | | OPERATION STATUS OF SWITCH | | | |
|---|---|---|---|---|---|---|
| | BIDIRECTIONAL DC/DC CONVERTER 10 | DC/AC INVERTER 20 | SWITCH Sstdu | SWITCH Sstdw | SWITCH Sgridu | SWITCH Sgridw |
| GRID CONNECTED OPERATION MODE M1 | CHARGE-DISCHARGE POWER CONTROL | DC BUS VOLTAGE (Vdc) CONTROL (CONSTANT-VOLTAGE CONTROL) | OFF | OFF | ON | ON |
| STAND-ALONE OPERATION MODE M2 | DC BUS VOLTAGE (Vdc) CONTROL (CONSTANT-VOLTAGE CONTROL) | AC OUTPUT VOLTAGE CONTROL (CONSTANT-VOLTAGE-AMPLITUDE CONTROL) | ON | ON | OFF | OFF |

FIG. 2

| CONTROL MODE | SETTING | | | | | | | |
|---|---|---|---|---|---|---|---|---|
| | PARA-METER a | PARA-METER b | SWITCH SWo | CONTROL SIGNAL Sgbu | CONTROL SIGNAL Sgbo | CONTROL SIGNAL Sgbw | SWITCH Sstdu | SWITCH Sstdw |
| SINGLE-PHASE THREE-WIRE OUTPUT MODE MA | 1 | 1 | T0 | 1 | 1 | 1 | ON | ON |
| OUTPUT STOP MODE MB | 1 | 1 | T0 | 0 | 0 | 0 | OFF | OFF |
| SINGLE-PHASE TWO-WIRE OUTPUT (U-O) MODE MC | 1 | 0 | T2 | 1 | 1 | 0 | ON | OFF |
| SINGLE-PHASE TWO-WIRE OUTPUT (W-O) MODE MD | 0 | −1 | T1 | 0 | 1 | 1 | OFF | ON |

FIG. 4

| Symbol | Parameter | Symbol | Parameter |
|---|---|---|---|
| Vdc | 400V | Cinv | 27μF |
| Cdc | 3000μF | Rc | 6mΩ |
| Linv | 200μH | Emax | 170V |
| Rinv | 5mΩ | Z1 | 5Ω |
| Z2 | 5Ω | fs | 20kHz |
| Td | 2μs | fsd | 60Hz |
| x | 0.1 | | |

FIG. 9

POWER CONVERSION DEVICE

CROSS REFERENCE TO RELATED APPLICATIONS

This application claims the benefit of Japanese Priority Patent Application No. 2018-062907 filed on Mar. 28, 2018, the entire contents of which are incorporated herein by reference.

BACKGROUND

The disclosure relates to a power conversion device that converts DC power to AC power.

In a case, for example, where power is supplied to a home electronic apparatus, a power conversion device of a single-phase three-wire system is often utilized. The power conversion device of the single-phase three-wire system includes two voltage lines that transmit respective two AC voltages having different phases, and one neutral line that transmits a neutral point voltage. For example, Japanese Unexamined Patent Application Publications No. 2015-231259, No. 2015-2657, and No. 2015-27197 each disclose the power conversion device of the single-phase three-wire system.

SUMMARY

A power conversion device according to one embodiment of the disclosure includes first paired switching elements, second paired switching elements, third paired switching elements, a first output terminal, a second output terminal, a third output terminal, a first low-pass filter, a second low-pass filter, and a control section. The first paired switching elements include a first switching element configured to couple a first voltage line to a first node and a second switching element configured to couple a second voltage line to the first node. The second paired switching elements include a third switching element configured to couple the first voltage line to a second node and a fourth switching element configured to couple the second voltage line to the second node. The third paired switching elements include a fifth switching element configured to couple the first voltage line to a third node and a sixth switching element configured to couple the second voltage line to the third node. The third output terminal is coupled directly or indirectly to the third node. The first low-pass filter is provided in a first path between the first node and the first output terminal, and is configured to remove a high-frequency component included in a voltage between the first node and the third node. The second low-pass filter is provided in a second path between the second node and the second output terminal, and is configured to remove a high-frequency component included in a voltage between the second node and the third node. The control section is configured to selectively bring one of the first paired switching elements and the second paired switching elements into an OFF state.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the disclosure.

FIG. 2 is a table indicating an operation example of the power conversion device illustrated in FIG. 1.

FIG. 4 is a table indicating an operation example of a DC/AC inverter illustrated in FIG. 1.

FIG. 9 is a table indicating simulation conditions.

DETAILED DESCRIPTION

Figure 1:
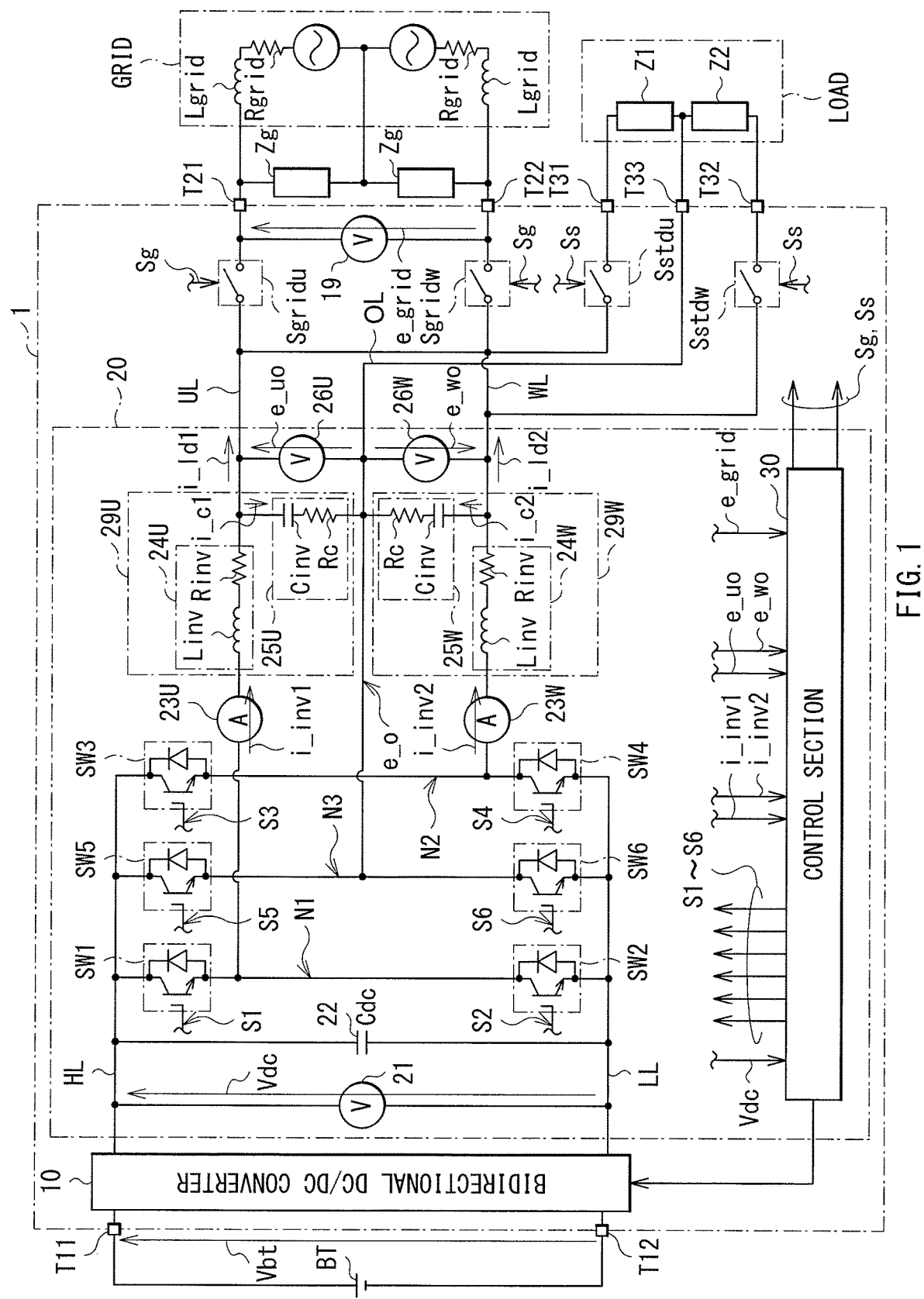
FIG. 1 is a circuit diagram illustrating a configuration example of a power conversion device according to one example embodiment of the disclosure.

Some embodiments of the disclosure are described below in detail with reference to the accompanying drawings.

It has been desired, for a power conversion device, to stop power supply to a load in a case where the load is in an overloaded state, for example. It is expected to enable the power conversion device to properly perform and stop power supply.

It is desirable to provide a power conversion device that makes it possible to properly perform and stop power supply.

It is to be noted that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. It is to be noted that the like elements are denoted with the same reference numerals, and any redundant description thereof will not be described in detail.

CONFIGURATION EXAMPLE

FIG. 1 illustrates a configuration example of a power conversion device (a power conversion device 1) according to an example embodiment of the disclosure. The power conversion device 1 may perform an operation using two operating modes including a grid connected operation mode M1 and a stand-alone operation mode M2.

The power conversion device 1 may include terminals T11 and T12, terminals T21 and T22, and terminals T31, T32, and T33. A battery BT may be coupled to each of the terminals T11 and T12. The battery BT may be, for example, a home battery or a battery for an electric vehicle. The terminals T21 and T22 may be each coupled to a commercial power source GRID, and the terminals T31, 32, and 33 may be each coupled to a load device LOAD. In the grid connected operation mode M1, the power conversion device 1 may be coupled to the commercial power source GRID using single-phase two wires to thereby charge and discharge the battery BT. In the stand-alone operation mode M2, the power conversion device 1 may be coupled to the load device LOAD using single-phase three wires to thereby supply power to the load device LOAD.

The power conversion device 1 may include a bidirectional DC/DC converter 10, a DC/AC inverter 20, switches Sgridu and Sgridw, a voltage detection section 19, and switches Sstdu and Sstdw.

The bidirectional DC/DC converter 10 may perform bidirectional power conversion in which a DC voltage is increased or decreased. The bidirectional DC/DC converter 10 may be, for example, a non-insulated DC/DC converter or an insulated DC/DC converter. The bidirectional DC/DC converter 10 may be coupled to the battery BT via the terminals T11 and T12, and may be coupled to a switching section including switching elements SW1 to SW6 via a high-voltage line HL and a low-voltage line LL. A battery voltage Vbt in the battery BT may be set to about 200 V to about 400 V, for example, and a voltage, i.e., a DC bus voltage Vdc between the high-voltage line HL and the low-voltage line LL may be set to about 400 V, for example. In a case where an operating mode of the power conversion device 1 is the grid connected operation mode M1, for example, the bidirectional DC/DC converter 10 may perform a charge-discharge control in which the battery BT is charged and discharged. In a case where the operating mode of the power conversion device 1 is the stand-alone operation mode M2, the bidirectional DC/DC converter 10 may perform a constant-voltage control to allow the DC bus voltage Vdc to be set to 400 V, for example.

The DC/AC inverter 20 may be a full-bridge inverter of a single-phase three-wire system, in which a DC voltage is converted to an AC voltage or an alternating current is converted to a DC voltage. In a case where the operating mode of the power conversion device 1 is the grid connected operation mode M1, the DC/AC inverter 20 may serve as a full-bridge inverter of a single-phase two-wire system. In a case where the operating mode of the power conversion device 1 is the stand-alone operation mode M2, the DC/AC inverter 20 may serve as the full-bridge inverter of the single-phase three-wire system. The DC/AC inverter 20 may include a voltage detection section 21, a capacitor 22, the switching elements SW1 to SW6, current detection sections 23U and 23W, low-pass filters 29U and 29W, voltage detection sections 26U and 26W, and a control section 30.

The voltage detection section 21 may detect the DC bus voltage Vdc. The voltage detection section 21 has one end that may be coupled to the high-voltage line HL and the other end that may be coupled to the low-voltage line LL. The voltage detection section 21 may detect, as the DC bus voltage Vdc, a voltage in the high-voltage line HL when viewed from a voltage in the low-voltage line LL. The voltage detection section 21 may supply the control section 30 with information about the detected DC bus voltage Vdc.

The capacitor 22 has one end that may be coupled to the high-voltage line HL and the other end that may be coupled to the low-voltage line LL. The capacitor 22 may be configured by an electrolytic capacitor, for example. The capacitor 22 may have a capacitance Cdc.

The switching elements SW1 to SW6 may perform switching operations on the basis of gate signals S1 to S6, respectively. The switching elements SW1 to SW6 may be each configured by an insulated gate bipolar transistor (IGBT), for example. The switching elements SW1 to SW6 may each include a free-wheeling diode. The free-wheeling diode of the switching element SW1 has an anode that may be coupled to an emitter of the switching element SW1 and a cathode that may be coupled to a collector of the switching element SW1. The same holds true also for the switching elements SW2 to SW6.

The switching element SW1 is brought into an ON state to thereby couple the high-voltage line HL to a node N1. The switching element SW1 has: the collector that may be coupled to the high-voltage line HL; a gate that may be supplied with the gate signal S1; and the emitter that may be coupled to the node N1. The switching element SW2 is brought into an ON state to thereby couple the low-voltage line LL to the node N1. The switching element SW2 has: a collector that may be coupled to the node N1; a gate that may be supplied with the gate signal S2; and an emitter that may be coupled to the low-voltage line LL. The node N1 may be a coupling point between the emitter of the switching element SW1 and the collector of the switching element SW2.

The switching element SW3 is brought into an ON state to thereby couple the high-voltage line HL to a node N2. The switching element SW3 has: a collector that may be coupled to the high-voltage line HL; a gate that may be supplied with the gate signal S3; and an emitter that may be coupled to the node N2. The switching element SW4 is brought into an ON state to thereby couple the low-voltage line LL to the node N2. The switching element SW4 has: a collector that may be coupled to the node N2; a gate that may be supplied with the gate signal S4; and an emitter that may be coupled to the low-voltage line LL. The node N2 may be a coupling point between the emitter of the switching element SW3 and the collector of the switching element SW4.

The switching element SW5 is brought into an ON state to thereby couple the high-voltage line HL to a node N3. The switching element SW5 has: a collector that may be coupled to the high-voltage line HL; a gate that may be supplied with the gate signal S5; and an emitter that may be coupled to the node N3. The switching element SW6 is brought into an ON state to thereby couple the low-voltage line LL to the node N3. The switching element SW6 has: a collector that may be coupled to the node N3; a gate that may be supplied with the gate signal S6; and an emitter that may be coupled to the low-voltage line LL. The node N3 may be a coupling point between the emitter of the switching element SW5 and the collector of the switching element SW6.

Paths from the node N1 to the terminals T21 and T31 may be each provided with the current detection section 23U and the low-pass filter 29U.

The current detection section 23U may detect a current i_inv1 flowing from the node N1 to the low-pass filter 29U. The current detection section 23U has one end that may be coupled to the node N1 and the other end that may be coupled to the low-pass filter 29U. The current detection section 23U may supply the control section 30 with information about the detected current i_inv1.

The low-pass filter 29U removes a high-frequency component included in a voltage difference between a voltage at the node N1 and a voltage at the node N3. The low-pass filter 29U may include an AC reactor 24U and a capacitor 25U. The AC reactor 24U has one end that may be coupled to the other end of the current detection section 23U and the other end that may be coupled to a U-phase voltage line UL. The AC reactor 24U may have an inductance Linv and an internal resistance value Rinv. The capacitor 25U has one end that may be coupled to the U-phase voltage line UL and the other end that may be coupled to a neutral line OL that links the node N3 and the terminal T33 together. The capacitor 25U may be configured by a film capacitor, for example. The capacitor 25U may have a capacitance Cinv and an internal resistance value Rc. This configuration allows the low-pass filter 29U to output a U-phase AC voltage having a sine waveform, for example.

The voltage detection section 26U may detect a voltage e_uo in association with the U-phase AC voltage to be outputted from the low-pass filter 29U. The voltage detection section 26U has one end that may be coupled to the U-phase voltage line UL and the other end that may be coupled to the neutral line OL. The voltage detection section 26U may detect, as the voltage e_uo, a voltage in the U-phase voltage line UL when viewed from a voltage in the neutral line OL. The voltage detection section 26U may supply the control section 30 with information about the detected voltage e_uo.

Paths from the node N2 to the terminals T22 and T32 may be each provided with the current detection section 23W and the low-pass filter 29W.

The current detection section 23W may detect a current i_inv2 flowing from the node N2 to the low-pass filter 29W. The current detection section 23W has one end that may be coupled to the node N2 and the other end that may be coupled to the low-pass filter 29W. The current detection section 23W may supply the control section 30 with information about the detected current i_inv2.

The low-pass filter 29W removes a high-frequency component included in a voltage difference between a voltage at the node N2 and the voltage at the node N3. The low-pass filter 29W may include an AC reactor 24W and a capacitor 25W. The AC reactor 24W has one end that may be coupled to the other end of the current detection section 23W and the other end that may be coupled to a W-phase voltage line WL. The AC reactor 24W may have an inductance Linv and an internal resistance value Rinv. The capacitor 25W has one end that may be coupled to the W-phase voltage line WL and the other end that may be coupled to the neutral line OL that links the node N3 and the terminal T33 together. The capacitor 25W may be configured by a film capacitor, for example. The capacitor 25W may have the capacitance Cinv and the internal resistance value Rc. This configuration allows the low-pass filter 29W to output a W-phase AC voltage having a sine waveform, for example.

The voltage detection section 26W may detect a voltage e_wo in association with the W-phase AC voltage to be outputted from the low-pass filter 29W. The voltage detection section 26W has one end that may be coupled to the W-phase voltage line WL and the other end that may be coupled to the neutral line OL. The voltage detection section 26W may detect, as the voltage e_wo, a voltage in the W-phase voltage line WL when viewed from a voltage in the neutral line OL. The voltage detection section 26W may supply the control section 30 with information about the detected voltage e_wo.

The switches Sgridu and Sgridw may be brought into an ON state in the grid connected operation mode M1 to thereby, respectively, couple the U-phase voltage line UL and the W-phase voltage line WL to the commercial power source GRID. The switch Sgridu has one end that may be coupled to the U-phase voltage line UL and the other end that may be coupled to the terminal T21. The switch Sgridw has one end that may be coupled to the W-phase voltage line WL and the other end that may be coupled to the terminal T22. The switches Sgridu and Sgridw may be each turned ON and OFF on the basis of a switch control signal Sg supplied form the control section 30. The switches Sgridu and Sgridw may be each configured by a relay, for example.

The voltage detection section 19 may detect a system voltage e_grid supplied from the commercial power source GRID. The voltage detection section 19 has one end that may be coupled to the terminal T21 and the other end that may be coupled to the terminal T22. The voltage detection section 19 may detect, as the system voltage e_grid, a voltage at the terminal T21 when viewed from a voltage at the terminal T22. The voltage detection section 19 may supply the control section 30 with information about the detected system voltage e_grid.

The terminals T21 and T22 may be each coupled to the commercial power source GRID. The commercial power source GRID may be a power source of the single-phase three-wire system. The U-phase voltage line of the commercial power source GRID may be coupled to the terminal T21 of the power conversion device 1, and the W-phase voltage line of the commercial power source GRID may be coupled to the terminal T22 of the power conversion device 1. The commercial power source GRID may have a system impedance, i.e., an inductance Lgrid and a resistance value Rgrid both between the U-phase voltage line and a neutral line and between the W-phase voltage line and the neutral line. A load device may be coupled to the commercial power source GRID. The load device may correspond to one or a plurality of electronic apparatuses in a home, for example. The load device may include two loads each having an impedance Zg. One load has one end that may be coupled to the U-phase voltage line of the commercial power source GRID and the other end that may be coupled to the neutral line. The other load has one end that may be coupled to the W-phase voltage line of the commercial power source GRID and the other end that may be coupled to the neutral line. In a case where the operating mode of the power conversion device 1 is the grid connected operation mode M1, the U-phase voltage line UL and the W-phase voltage line WL of the power conversion device 1 may be each coupled to the commercial power source GRID, whereas the neutral line OL of the power conversion device 1 may not be coupled to the commercial power source GRID. As described above, in the power conversion device 1, causing the neutral line OL of the power conversion device 1 not to be coupled to the neutral line of the commercial power source GRID in the grid connected operation mode M1 suppresses propagation of noise.

The switches Sstdu and Sstdw may be brought into an ON state in the stand-alone operation mode M2 to thereby, respectively, couple the U-phase voltage line UL and the W-phase voltage line WL to the load device LOAD. The switch Sstdu has one end that may be coupled to the U-phase voltage line UL and the other end that may be coupled to the terminal T31. The switch Sstdw has one end that may be coupled to the W-phase voltage line WL and the other end that may be coupled to the terminal T32. The switches Sstdu and Sstdw may be each turned ON and OFF on the basis of a switch control signal Ss supplied form the control section 30. The switches Sstdu and Sstdw may be each configured by a relay, for example.

The terminals T31, T32, and T33 may be each coupled to the load device LOAD. The load device LOAD corresponds to one or a plurality of electronic apparatuses in a home or in a vehicle, for example. The load device LOAD may include a load, i.e., a U-phase load having an impedance Z1 and a load, i.e., a W-phase load having an impedance Z2. The U-phase load has one end that may be coupled to the terminal T31 and the other end that may be coupled to the terminal T33. The W-phase load has one end that may be coupled to the terminal T32 and the other end that may be coupled to the terminal T33. In a case where the operating mode of the power conversion device 1 is the stand-alone operation mode M2, the U-phase voltage line UL and the W-phase voltage line WL of the power conversion device 1 may be each coupled to the load device LOAD. In this example, the neutral line OL of the power conversion device 1 may be constantly coupled to the load device LOAD.

The control section 30 may control an operation of the DC/AC inverter 20. The control section 30 may also serve to control an operation of the bidirectional DC/DC converter 10 and an operation of each of the switches Sstdu, Sstdw, Sgridu, and Sgridw. The control section 30 may be configured by a microcontroller, for example.

FIG. 2 illustrates an operation of the power conversion device 1. FIG. 2 illustrates respective operations of the bidirectional DC/DC converter 10, the DC/AC inverter 20, and the switches Sstdu, Sstdw, Sgridu, and Sgridw.

In the grid connected operation mode M1, the switches Sgridu and Sgridw may be brought into an ON state and the switches Sstdu and Sstdw may be brought into an OFF state. This causes the commercial power source GRID to be coupled to the power conversion device 1 and the load device LOAD to be decoupled from the power conversion device 1. On the basis of an AC voltage supplied from the commercial power source GRID, the DC/AC inverter 20 may perform a constant-voltage control to allow the DC bus voltage Vdc to be a predetermined voltage, e.g., 400 V. Further, the bidirectional DC/DC converter 10 may perform a charge-discharge power control on the battery BT.

In the stand-alone operation mode M2, for example, the switches Sstdu and Sstdw may be brought into an ON state, and the switches Sgridu and Sgridw may be brought into an OFF state. This causes the load device LOAD, for example, to be coupled to the power conversion device 1 and the commercial power source GRID to be decoupled from the power conversion device 1. On the basis of the battery voltage Vbt in the battery BT, the bidirectional DC/DC converter 10 may perform the constant-voltage control to allow the DC bus voltage Vdc to be a predetermined voltage, e.g., 400 V. The DC/AC inverter 20 may perform a constant-voltage-amplitude control to allow, for example, a voltage amplitude of an AC output voltage e_uw to be a predetermined amplitude. The AC output voltage e_uw may be a voltage difference between a voltage in the U-phase voltage line UL and a voltage in the W-phase voltage line WL. In the stand-alone operation mode M2, the power conversion device 1 may control a voltage of a neutral point, i.e., the neutral line OL to maintain a balance of the voltage at the neutral point. This enables the power conversion device 1 to supply a stable AC voltage to all of various load devices in a home, for example.

In order for the power conversion device 1 to perform such operations in the grid connected operation mode M1 and the stand-alone operation mode M2, the control section 30 may control the operation of the DC/AC inverter 20, the operation of the bidirectional DC/DC converter 10, and the operation of each of the switches Sstdu, Sstdw, Sgridu, and Sgridw.

[DC/AC Inverter 20]

The control section 30 may generate the gate signals S1 to S6 to be supplied, respectively, to the switching elements SW1 to SW6 on the basis of the following information. Non-limiting examples of the information may include the information about the DC bus voltage Vdc supplied from the voltage detection section 21, the information about the currents i_inv1 and i_inv2 supplied, respectively, from the current detection sections 23U and 23W, the information about the voltages e_uo and e_wo supplied, respectively, from the voltage detection sections 26U and 26W, and the information about the system voltage e_grid supplied from the voltage detection section 19. The control section 30 may perform AD conversion, for example, on the information about the DC bus voltage Vdc supplied from the voltage detection section 21 to thereby determine a digital value indicating the DC bus voltage Vdc and thus to perform the control on the basis of the digital value. The same holds true also for the currents i_inv1 and i_inv2, the voltages e_uo and e_wo, and the voltage e_grid. Hereinafter, the currents i_inv1 and i_inv2, the voltages e_uo and e_wo, and the voltage e_grid may be used appropriately as those indicating AD-converted digital values.

In the grid connected operation mode M1, the control section 30 may generate the gate signal S1 to S4 on the basis of the information about the system voltage e_grid supplied from the voltage detection section 19, for example. This causes the switching elements SW1 to SW4 to be turned ON and OFF on the basis of the gate signals S1 to S4, respectively, in synchronization with the AC voltage supplied from the commercial power source GRID. The switching elements SW5 and SW6 may maintain an OFF state, for example. This causes the DC/AC inverter 20 to perform the constant-voltage control to allow the DC bus voltage Vdc to be a predetermined voltage. In a specific but non-limiting example, the DC/AC inverter 20 may perform, for example, an operation similar to an operation of bipolar pulse width modulation (PWM) or an operation of a unipolar PWM described later to thereby enable the constant-voltage control to be performed.

Meanwhile, in the stand-alone operation mode M2, the control section 30 may generate the gate signals S1 to S6 on the basis of the following information. Non-limiting examples of the information may include the information about the DC bus voltage Vdc supplied from the voltage detection section 21, the information about the currents i_inv1 and i_inv2 supplied, respectively, from the current detection sections 23U and 23W, and the information about the voltages e_uo and e_wo supplied, respectively, from the voltage detection sections 26U and 26W. The switching elements SW1 to SW6 may be turned ON and OFF on the basis of the gate signals S1 to S6, respectively. For example, the DC/AC inverter 20 may turn ON and OFF the switching elements SW1 to SW4 to thereby perform the constant-voltage-amplitude control to allow the voltage amplitude of the AC output voltage to be a predetermined amplitude. Further, the DC/AC inverter 20 may turn ON and OFF the switching elements SW5 and SW6 to thereby control a voltage of the neutral point, i.e., the neutral line OL to maintain a balance of the voltage at the neutral point.

Description is given below in detail of a circuit configuration of an operation of the control section 30 in the stand-alone operation mode M2.

Figure 3:
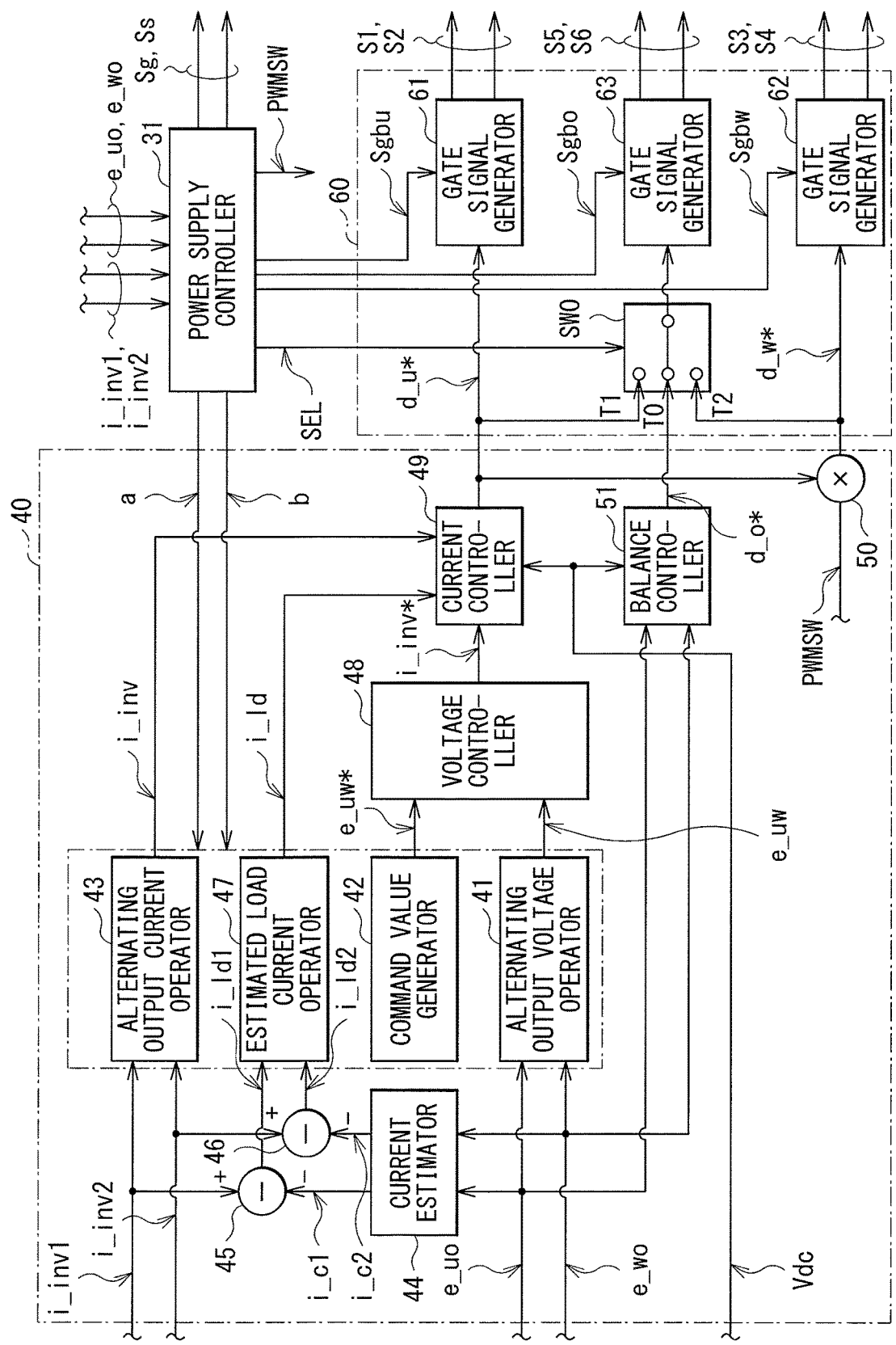
FIG. 3 is a block diagram illustrating a configuration example of a control section illustrated in FIG. 1.

FIG. 3 illustrates a configuration example of a circuit that controls the operation of the DC/AC inverter 20, in the control section 30. The control section 30 may include a duty ratio generation section 40, a drive section 60, and a power supply controller 31.

The duty ratio generation section 40 may generate duty ratio command values d_u*, d_w*, and d_o*. The duty ratio generation section 40 may include an AC output voltage operator 41, a command value generator 42, an AC output current operator 43, a current estimator 44, subtractors 45 and 46, an estimated load current operator 47, a voltage controller 48, a current controller 49, a multiplier 50, and a balance controller 51. Operational expressions to be used in operational processing of the duty ratio generation section 40 are as follows.

$$\left.\begin{array}{l} e\_uw = a \cdot e\_uo - b \cdot e\_wo \\ e\_uw^* = (a+b) \cdot Emax \cdot \sin(\theta sd) \\ i\_inv = a \cdot i\_inv1 - b \cdot i\_inv2 \\ i\_ld1 = i\_inv1 - i\_c1 \\ i\_ld2 = i\_inv2 - i\_c2 \\ i\_ld = a \cdot i\_ld1 - b \cdot i\_ld2 \end{array}\right\} \quad (EQ1)$$

$$\left.\begin{array}{l} i\_c1 = \sqrt{2} \cdot Euorms \cdot 2\pi fsd \cdot Cinv \cdot \sin\left(\theta sd + \dfrac{\pi}{2}\right) \\ i\_c2 = \sqrt{2} \cdot Euorms \cdot 2\pi fsd \cdot Cinv \cdot \sin\left(\theta sd + \dfrac{\pi}{2}\right) \end{array}\right\} \quad (EQ2)$$

$$\left.\begin{array}{l} Euorms = \sqrt{\dfrac{1}{Tsd}\int_0^{Tsd}(e\_uo(t))^2 dt} \\ Eworms = \sqrt{\dfrac{1}{Tsd}\int_0^{Tsd}(e\_wo(t))^2 dt} \\ Tsd = \dfrac{1}{fsd} \end{array}\right\} \quad (EQ3)$$

The AC output voltage operator 41 may use the first expression of Expressions EQ1 on the basis of the voltages e_uo and e_wo as well as parameters a and b supplied form the power supply controller 31 to thereby determine the AC output voltage e_uw. As described later, the parameter a may be set to "1" or "0", and the parameter b may be set to one of "1", "0", and "−1".

The command value generator 42 may use the second expression of Expressions EQ1 on the basis of the parameters a and b to thereby generate a command value e_uw* of the AC output voltage e_uw. In the second expression of Expressions EQ1, Emax denotes an amplitude value, and θsd denotes a phase angle. The phase angle θsd is a function of time t, and varies depending on a stand-alone operation frequency θsd (e.g., 60 Hz).

The AC output current operator 43 may use the third expression of Expressions EQ1 on the basis of the currents i_inv1 and i_inv2 as well as the parameters a and b to thereby determine an AC output current i_inv.

The current estimator 44 may use Expressions EQ2 on the basis of the voltages e_uo and e_wo to thereby estimate a current, i.e., an estimated current i_c1 flowing to the capacitor 25U and estimate a current, i.e., an estimated current i_c2 flowing to the capacitor 25W. As illustrated in FIG. 1, the estimated current i_c1 is a current flowing toward the capacitor 25U from the AC reactor 24U, and the estimated current i_c2 is a current flowing toward the capacitor 25W from the AC reactor 24W. In Expressions EQ2, Euorms denotes an effective value of the voltage e_uo, and Eworms denotes an effective value of the voltage e_wo. The effective values Euorms and Eworms may be determined on the basis of the voltages e_uo and e_wo using Expressions EQ3, for example.

On the basis of the current i_inv1 and the estimated current i_c1, the subtractor 45 may subtract the estimated current i_c1 from the current i_inv1 to thereby determine an estimated load current i_ld1, as indicated by the fourth expression of Expressions EQ1. As illustrated in FIG. 1, the estimated load current i_ld1 is an output current of the low-pass filter 29U in the U-phase voltage line UL, and is a current flowing to the terminal T31 as well.

On the basis of the current i_inv2 and the estimated current i_c2, the subtractor 46 may subtract the estimated current i_c2 from the current i_inv2 to determine an estimated load current i_ld2, as indicated by the fifth expression of Expressions EQ1. As illustrated in FIG. 1, the estimated load current i_ld2 is an output current of the low-pass filter 29W in the W-phase voltage line WL, and is a current flowing to the terminal T32 as well.

The estimated load current operator 47 may use the sixth expression of Expressions EQ1 on the basis of the estimated load currents i_ld1 and i_ld2 as well as the parameters a and b to thereby determine an estimated load current i_ld.

The voltage controller 48 may generate a command value i_inv* of the AC output current i_inv on the basis of the AC output voltage e_uw and the command value e_uw* of the AC output voltage e_uw.

The current controller 49 may determine the duty ratio command value d_u* on the basis of the AC output current i_inv, the command value i_inv* of the AC output current i_inv, the estimated load current i_ld, and the DC bus voltage Vdc. The duty ratio command value d_u* may be a value in a range from "−1" to "1".

The multiplier 50 may multiply the duty ratio command value d_u* and a parameter PWMSW together to thereby determine the duty ratio command value d_w*. As described later, the parameter PWMSW may be set to "1" when the DC/AC inverter 20 performs the bipolar PWM operation, and may be set to "−1" when the DC/AC inverter 20 performs the unipolar PWM operation.

The balance controller 51 may generate the duty ratio command value d_o* on the basis of the voltages e_uo and e_wo as well as the DC bus voltage Vdc.

The drive section 60 may generate the gate signals S1 to S6 on the basis of the duty ratio command values d_u*, d_w*, and d_o*. The drive section 60 may drive the switching elements SW1 and SW2 using the gate signals S1 and S2, respectively. The drive section 60 may drive the switching elements SW3 and SW4 using the gate signals S3 and S4, respectively. The drive section 60 may drive the switching elements SW5 and SW6 using the gate signals S5 and S6, respectively. The drive section 60 may include a switch SW0 and a gate signal generator 61.

On the basis of a control signal SEL, the switch SW0 may select one of three input terminals T0, T1, and T2 to supply a gate signal generator 63 with a duty ratio command value supplied to the selected input terminal.

The gate signal generator 61 may use the pulse width modulation (PWM) on the basis of the duty ratio command value d_u* to generate the gate signals S1 and S2. The gate signal generator 61 may also serve to stop the generation of the gate signals S1 and S2 on the basis of a control signal Sgbu. In a specific but non-limiting example, the gate signal generator 61 may generate the gate signals S1 and S2 on the basis of the duty ratio command value d_u* in a case where the control signal Sgbu is "1", and may set each of the gate signals S1 and S2 to a low level, i.e., "0" in a case where the control signal Sgbu is "O". The switching elements SW1 and SW2 illustrated in FIG. 1 may be brought into an OFF state on the basis of, respectively, the gate signals S1 and S2 that are in the low level, i.e., "0". In this manner, the control signal Sgbu may serve as a so-called gate block signal of the switching elements SW1 and SW2.

The gate signal generator 62 may use the PWM on the basis of the duty ratio command value d_w* to generate the gate signals S3 and S4. The gate signal generator 62 may also serve to stop the generation of the gate signals S3 and S4 on the basis of a control signal Sgbw. In a specific but non-limiting example, the gate signal generator 62 may generate the gate signals S3 and S4 on the basis of the duty ratio command value d_w* in a case where the control signal Sgbw is "1", and may set each of the gate signals S3 and S4 to a low level, i.e., "0" in a case where the control signal Sgbw is "0". The switching elements SW3 and SW4 illustrated in FIG. 1 may be brought into an OFF state on the basis of, respectively, the gate signals S3 and S4 that are in the low level, i.e., "0". In this manner, the control signal Sgbw may serve as a so-called gate block signal of the switching elements SW3 and SW4.

The gate signal generator 63 may use the PWM on the basis of a duty ratio command value supplied from the switch SW0 to generate the gate signals S5 and S6. The gate signal generator 63 may also serve to stop the generation of the gate signals S5 and S6 on the basis of a control signal Sgbo. In a specific but non-limiting example, the gate signal generator 63 may generate the gate signals S5 and S6 on the basis of the duty ratio command value supplied from the switch SW0 in a case where the control signal Sgbo is "1", and may set each of the gate signals S5 and S6 to a low level, i.e., "O" in a case where the control signal Sgbo is "0". The switching elements SW5 and SW6 illustrated in FIG. 1 may be brought into an OFF state on the basis of, respectively, the gate signals S5 and S6 that are in the low level, i.e., "0". In this manner, the control signal Sgbo may serve as a so-called gate block signal of the switching elements SW5 and SW6.

The power supply controller 31 may generate the parameters a and b, the control signal SEL, the control signals Sgbu, Sgbw, and Sgbo, the parameters PWMSEL, and the switch control signals Sg and Ss on the basis of the voltages e_uo and e_wo as well as the currents i_inv1 and i_inv2 to thereby control an operation of the DC/AC inverter 20 to supply power to the load device LOAD. In a specific but non-limiting example, in a case where the power supply controller 31 detects that the U-phase load, e.g., the impedance Z1 in FIG. 1 is in an overloaded state on the basis of the voltage e_uo and the current i_inv1, for example, the power supply controller 31 may stop the operation to supply power to the U-phase load. Further, in a case where the power supply controller 31 detects that the W-phase load, e.g., the impedance Z2 in FIG. 1 is in an overloaded state on the basis of the voltage e_wo and the current i_inv2, the power supply controller 31 may stop the operation to supply power to the W-phase load.

That is, for example, in a case where the U-phase load is in an overloaded state, turning ON and OFF the switching elements SW1 to SW4 enables voltage amplitude of the AC output voltage to be constant. This prevents the voltage amplitude from exceeding a predetermined amplitude. However, there is a possibility that turning ON and OFF the switching elements SW5 and SW6 may not be able to maintain a balance of the voltage at the neutral point, i.e., the neutral line OL. In other words, controlling to allow the voltage amplitude of the AC output voltage to be constant may lower the voltage e_uo of the U-phase due to the overloaded state of the U-phase load, thus raising the voltage e_wo of the W-phase. This leads to a possibility that the balance of the voltage at the neutral point may not be able to be maintained. When such an overloaded state continues, excessive voltage e_wo may be supplied to an electronic apparatus corresponding to the W-phase load, e.g., the impedance Z2 in FIG. 1, thus leading to a possibility that the electronic apparatus may break down. Accordingly, when it is detected that the U-phase load is in the overloaded state, the power conversion device 1 may perform control to stop power supply to the U-phase load immediately and to return the voltage e_wo of the W-phase to the normal voltage. This enables the power conversion device 1 to continue power supply to the W-phase load and to reduce a possibility that the electronic apparatus corresponding to the W-phase may break down. Although the description has been given above by exemplifying the case where the U-phase load is in an overloaded state, the same holds true also for the case where the W-phase load is in an overloaded state.

FIG. 4 illustrates an operation example of the power supply controller 31 in a case where the operating mode of the power conversion device 1 is the stand-alone operation mode M2. The DC/AC inverter 20 may have, in the stand-alone operation mode M2, four control modes, i.e., a single-phase three-wire output mode MA, an output stop mode MB, a single-phase two-wire output (U-O) mode MC, and a single-phase two-wire output (W-O) mode MD.

Figure 5A:
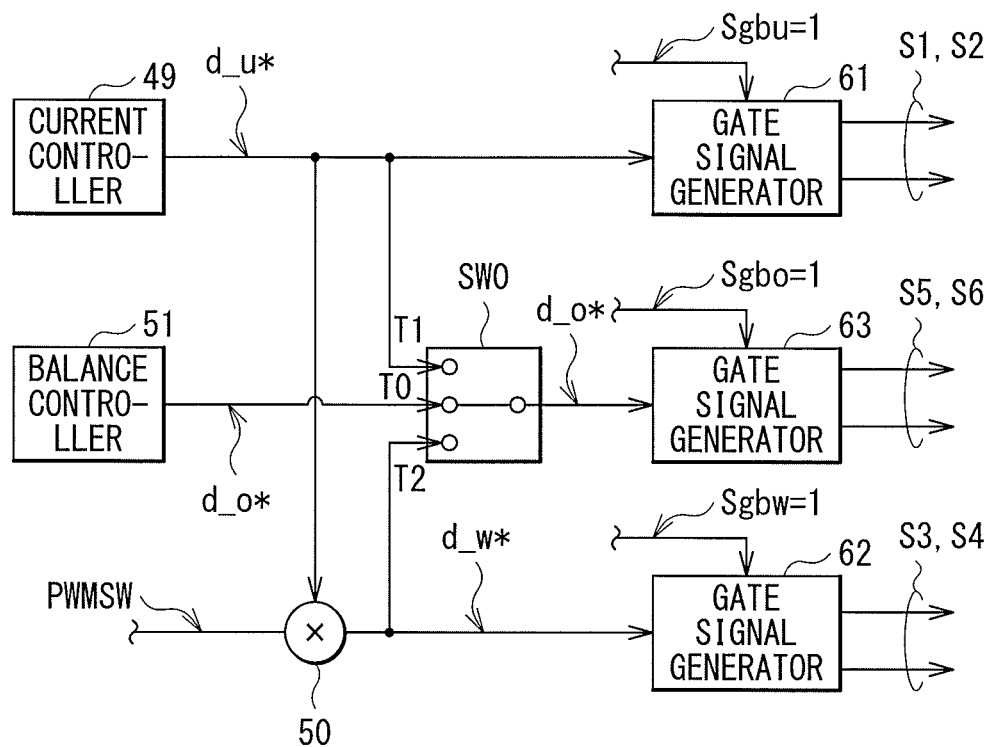
FIG. 5A describes an operation example of the control section illustrated in FIG. 3.

The single-phase three-wire output mode MA is a mode in which power may be supplied to both of the U-phase load, e.g., the impedance Z1 in FIG. 1 and the W-phase load, e.g., the impedance Z2 in FIG. 1. In the single-phase three-wire output mode MA, the switches Sstdu and Sstdw may be both brought into an ON state to cause the U-phase load and the W-phase load to be each coupled to the power conversion device 1. The parameters a and b may be both set to "1". Accordingly, as indicated by Expressions EQ1, the control section 30 may determine the command value e_uw* of the AC output voltage e_uw on the basis of the parameters a and b. The control section 30 may determine the AC output voltage e_uw on the basis of both of the voltages e_uo and e_wo. The control section 30 may determine the AC output current i_inv on the basis of both of the currents i_inv1 and i_inv2. The control section 30 may determine the estimated load current i_ld on the basis of both of the estimated load currents i_ld1 and i_ld2. In the switch SW0, the input terminal TO may be selected, and the control signals Sgbu, Sgbo, and Sgbw may be set, respectively, to "1", "1", and "1". This causes the duty ratio command value d_o* to be supplied to the gate signal generator 63, as illustrated in FIG. 5A. The gate signal generator 61 may generate the gate signals S1 and S2 on the basis of the duty ratio command value d_u*. The gate signal generator 62 may generate the gate signals S3 and S4 on the basis of the duty ratio command value d_w*. The gate signal generator 63 may generate the gate signals S5 and S6 on the basis of the duty ratio command value d_o*. This causes the switching elements SW1 and SW2 to be turned ON and OFF on the basis of the gate signals S1 and S2, respectively; the switching elements SW3 and SW4 to be turned ON and OFF on the basis of the gate signals S3 and S4, respectively; and the switching elements SW5 and SW6 to be turned ON and OFF on the basis of the gate signals S5 and S6, respectively.

Figure 5B:
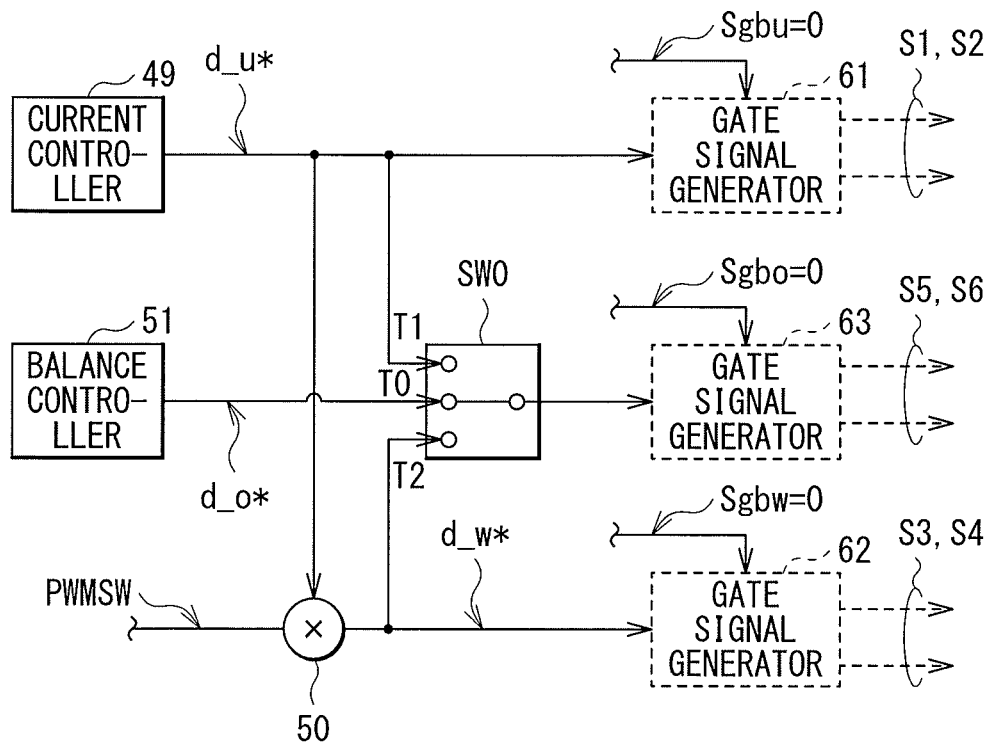
FIG. 5B describes another operation example of the control section illustrated in FIG. 3.

The output stop mode MB is a mode in which power supply to both of the U-phase load and the W-phase load may be stopped. In the output stop mode MB, the switches Sstdu and Sstdw may be both brought into an OFF state to cause the U-phase load and the W-phase load to be each cut off from the power conversion device 1. The parameters a and b may be both set to "1". In the switch SW0, the input terminal T0 may be selected, and the control signals Sgbu, Sgbo, and Sgbw may be set, respectively, to "0", "0", and "0". This causes, as illustrated in FIG. 5B, the gate signal generator 61 to set each of the gate signals S1 and S2 to the low level, i.e., "0"; the gate signal generator 62 to set each of the gate signals S3 and S4 to the low level, i.e., "0"; and the gate signal generator 63 to set each of the gate signals S5 and S6 to the low level, i.e., "0". This brings all of the switching elements SW1 to SW6 into an OFF state. In FIG. 5B, the gate signal generators in which a gate signal to be outputted is set to the low level are each indicated by a broken line. In this example, the gate signal generators 61, 62, and 63 are each indicated by a broken line.

Figure 5C:
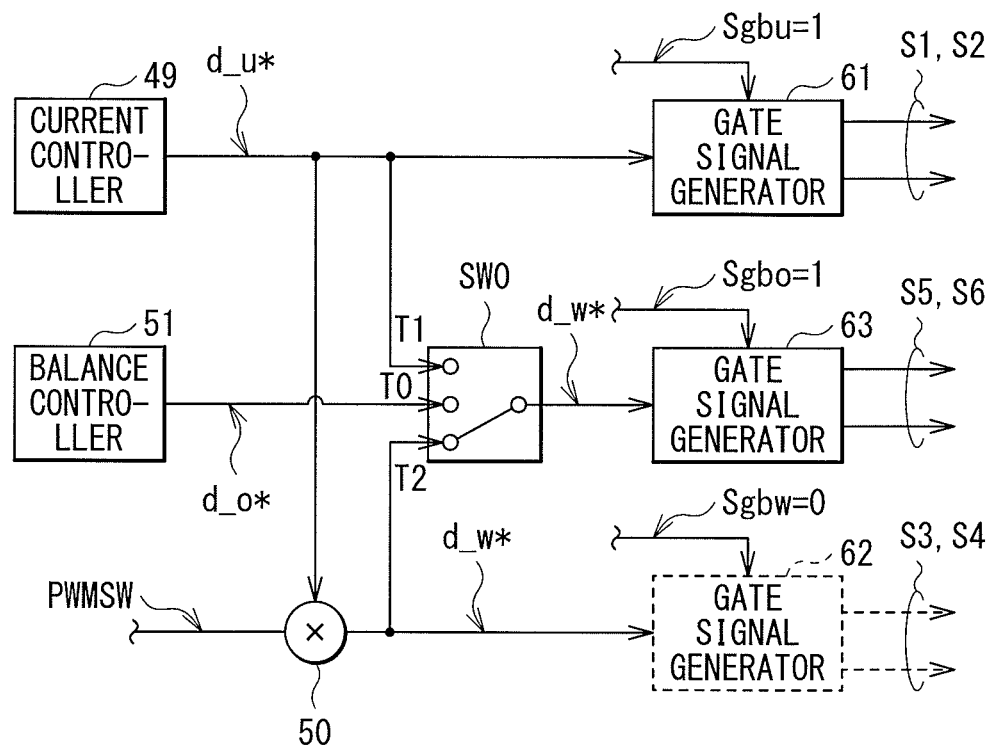
FIG. 5C describes another operation example of the control section illustrated in FIG. 3.

In the single-phase two-wire output (U-O) mode MC, power may be supplied to the U-phase load, and the power supply to the W-phase load may be stopped. In the single-phase two-wire output (U-O) mode MC, the switch Sstdu may be brought into an ON state, and the switch Sstdw may be brought into an OFF state. This causes the U-phase load to be coupled to the power conversion device 1 and the W-phase load to be cut off from the power conversion device 1. The parameter a may be set to "1", and the parameter b may be set to "0". This causes the control section 30 to determine the command value e_uw* of the AC output voltage e_uw on the basis of the parameters a and b, as indicated by Expressions EQ1. The parameter b may be "0", and thus the control section 30 may determine the AC output voltage e_uw on the basis of the voltage e_uo; the AC output current i_inv on the basis of the current i_inv1; and the estimated load current i_ld on the basis of the estimated load current i_ld1. In the switch SW0, the input terminal T2 may be selected, and the control signals Sgbu, Sgbo, and Sgbw may be set, respectively, to "1", "1", and "0". This causes the duty ratio command value d_w* to be supplied to the gate signal generator 63, as illustrated in FIG. 5C. The gate signal generator 61 may generate the gate signals S1 and S2 on the basis of the duty ratio command value d_u*. The gate signal generator 62 may set each of the gate signals S3 and S4 to the low level, i.e., "0". The gate signal generator 63 may generate the gate signals S5 and S6 on the basis of the duty ratio command value d_w*. This causes the switching elements SW1 and SW2 to be turned ON and OFF on the basis of the gate signals S1 and S2, respectively; the switching elements SW3 and SW4 to be brought into an OFF state; and the switching elements SW5 and SW6 to be turned ON and OFF on the basis of the gate signals S5 and S6, respectively. In FIG. 5C, the gate signal generator in which a gate signal to be outputted is set to the low level is indicated by a broken line. In this example, the gate signal generators 62 is indicated by a broken line.

Figure 5D:
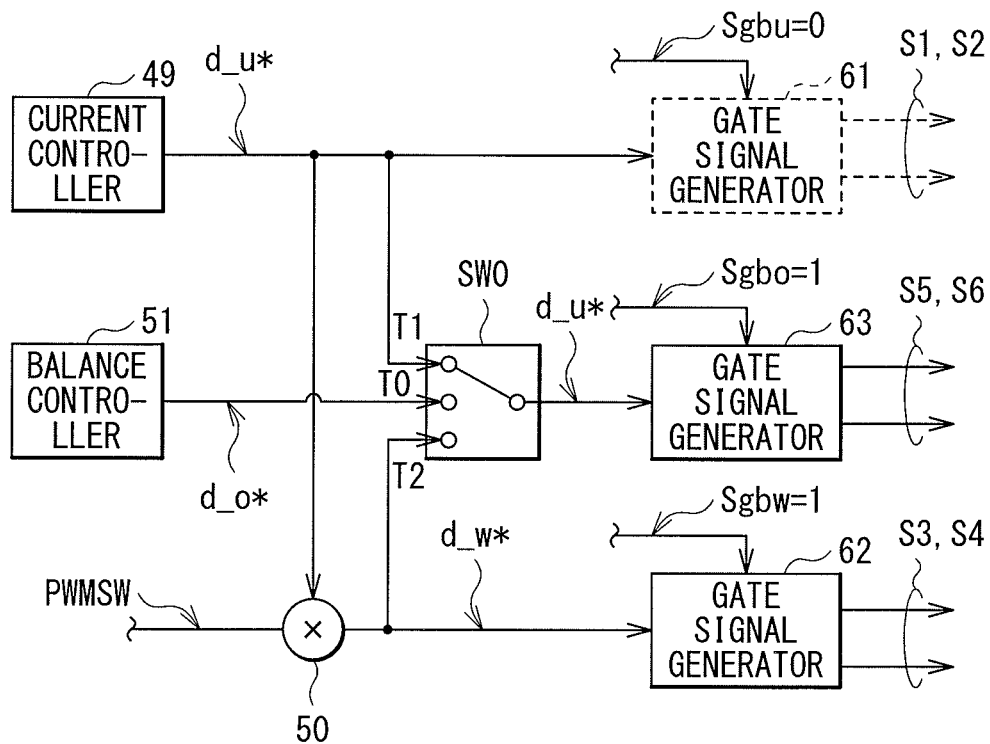
FIG. 5D describes another operation example of the control section illustrated in FIG. 3.

In the single-phase two-wire output (W-O) mode MD, power may be supplied to the W-phase load, and the power supply to the U-phase load may be stopped. In the single-phase two-wire output (W-O) mode MD, the switch Sstdw may be brought into an ON state, and the switch Sstdu may be brought into an OFF state. This causes the W-phase load to be coupled to the power conversion device 1 and the U-phase load to be cut off from the power conversion device 1. The parameter a may be set to "0", and the parameter b may be set to "−1". This causes the control section 30 to determine the command value e_uw* of the AC output voltage e_uw on the basis of the parameters a and b, as indicated by Expressions EQ1. The parameter a may be "0", and thus the control section 30 may determine the AC output voltage e_uw on the basis of the voltage e_wo; the AC output current i_inv on the basis of the current i_inv2; and the estimated load current i_ld on the basis of the estimated load current i_ld2. In the switch SW0, the input terminal T1 may be selected, and the control signals Sgbu, Sgbo, and Sgbw may be set, respectively, to "0", "1", and "1". This causes the duty ratio command value d_u* to be supplied to the gate signal generator 63, as illustrated in FIG. 5D. The gate signal generator 61 may set each of the gate signals S1 and S2 to the low level, i.e., "0". The gate signal generator 62 may generate the gate signals S3 and S4 on the basis of the duty ratio command value d_w*. The gate signal generator 63 may generate the gate signals S5 and S6 on the basis of the duty ratio command value d_u*. This causes the switching elements SW1 and SW2 to be brought into an OFF state; the switching elements SW3 and SW4 to be turned ON and OFF on the basis of the gate signals S3 and S4, respectively; and the switching elements SW5 and SW6 to be turned ON and OFF on the basis of the gate signals S5 and S6, respectively. In FIG. 5D, the gate signal generator in which a gate signal to be outputted is set to the low level is indicated by a broken line. In this example, the gate signal generators 61 is indicated by a broken line.

Figure 6:
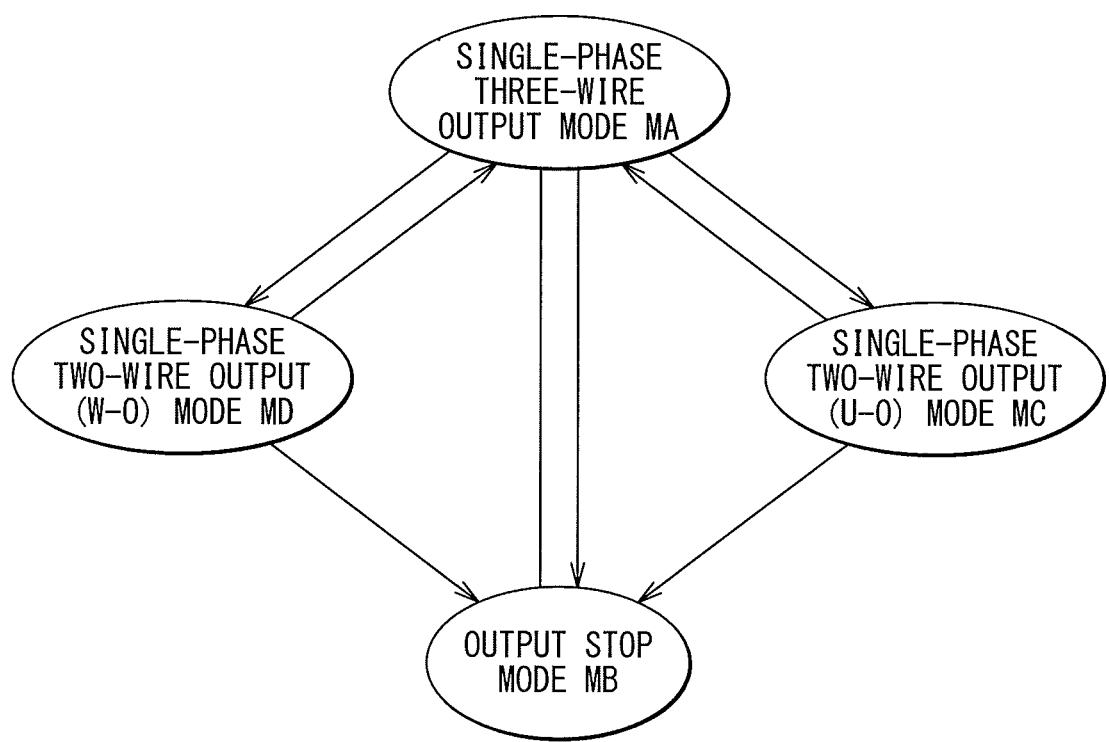
FIG. 6 is a transition diagram illustrating an operation example of the DC/AC inverter illustrated in FIG. 1.

FIG. 6 illustrates transitions among the four control modes.

For example, in a case where the DC/AC inverter 20 performs in the single-phase three-wire output mode MA, and where the power supply controller 31 determines that the U-phase load is in an overloaded state, the control mode may make transition from the single-phase three-wire output mode MA to the single-phase two-wire output (W-O) mode MD.

In a case where the DC/AC inverter 20 performs in the single-phase two-wire output (W-O) mode MD, and where the overloaded state in the U-phase load is dissolved, the control mode may make transition from the single-phase two-wire output (W-O) mode MD to the single-phase three-wire output mode MA. In a specific but non-limiting example, the power supply controller 31 may cause the control mode to make transition from the single-phase two-wire output (W-O) mode MD to the single-phase three-wire output mode MA at a timing that satisfies the following Expression EQ4.

$$|e\_uo - e\_wo| \leq x \cdot Emax \tag{EQ4}$$

Here, the parameter x may be set to about "0.1", for example. That is, the voltage e_uo may be "0", for example, in the single-phase two-wire output (W-O) mode MD. Accordingly, the control mode may make transition from the single-phase two-wire output (W-O) mode MD to the single-phase three-wire output mode MA at a timing when an absolute value of the voltage e_wo becomes sufficiently smaller than the amplitude value Emax. In other words, the control mode may make transition from the single-phase two-wire output (W-O) mode MD to the single-phase three-wire output mode MA near a so-called zero-cross timing. Accordingly, it becomes possible for the DC/AC inverter 20 to start generation of the voltage e_uo in a short period of time after beginning to operate in the single-phase three-wire output mode MA, and thus to start a stable operation in a short period of time.

For example, in a case where the DC/AC inverter 20 performs in the single-phase two-wire output (W-O) mode MD, and where the power supply controller 31 determines that the W-phase load is in an overloaded state, the control mode may make transition from the single-phase two-wire output (W-O) mode MD to the output stop mode MB. When the overloaded state in the U-phase load and the overloaded state in the W-phase load are dissolved, the control mode may make transition from the output stop mode MB to the single-phase three-wire output mode MA.

Likewise, for example, in a case where the DC/AC inverter 20 performs in the single-phase three-wire output mode MA, and where the power supply controller 31 determines that the W-phase load is in an overloaded state, the control mode may make transition from the single-phase three-wire output mode MA to the single-phase two-wire output (U-O) mode MC.

In a case where the DC/AC inverter 20 performs in the single-phase two-wire output (U-O) mode MC, and where the overloaded state in the W-phase load is dissolved, the control mode may make transition from the single-phase two-wire output (U-O) mode MC to the single-phase three-wire output mode MA. In this case as well, the power supply controller 31 may cause the control mode to make transition from the single-phase two-wire output (U-O) mode MC to the single-phase three-wire output mode MA at a timing that satisfies Expression EQ4. That is, in the single-phase two-wire output (U-O) mode MC, the voltage e_wo may be "0", for example. Accordingly, the control mode may make transition from the single-phase two-wire output (U-O) mode MC to the single-phase three-wire output mode MA at a timing when an absolute value of the voltage e_uo becomes sufficiently smaller than the amplitude value Emax. This enables the DC/AC inverter 20 to start generation of the voltage e_wo in a short period of time, and thus to start a stable operation in a short period of time.

For example, in a case where the DC/AC inverter 20 performs in the single-phase two-wire output (U-O) mode MC, and where the power supply controller 31 determines that the U-phase load is in an overloaded state, the control mode may make transition from the single-phase two-wire output (U-O) mode MC to the output stop mode MB. When the overloaded state in the U-phase load and the overloaded state in the W-phase load are dissolved, the control mode may make transition from the output stop mode MB to the single-phase three-wire output mode MA.

Likewise, for example, in a case where the DC/AC inverter 20 performs in the single-phase three-wire output mode MA, and where the power supply controller 31 determines that both of the W-phase load and the U-phase load are in an overloaded state, the control mode may make transition from the single-phase three-wire output mode MA to the output stop mode MB. When the overloaded state in the U-phase load and the overloaded state in the W-phase load are dissolved, the control mode may make transition from the output stop mode MB to the single-phase three-wire output mode MA.

In this manner, the power supply controller 31 may control the operation of the DC/AC inverter 20 to supply power to the load device LOAD using the four control modes.

Further, the power supply controller 31 may also serve to generate the parameter PWMSW. The parameter PWMSW may be set depending on whether the bidirectional DC/DC converter 10 is the non-insulated DC/DC converter or the insulated DC/DC converter.

The control section 30 may perform an operation, for example, for each cycle Ts, e.g., 50 μsec. (=1/20 kHz) on the basis of the currents i_inv1 and i_inv2, the voltages e_uo and e_wo, and the DC bus voltage Vdc to thereby determine the duty ratio command values d_u*, d_w*, and d_o* and generate the gate signals S1 to S6 on the basis of these command values d_u*, d_w*, and d_o*. In the power conversion device 1, a loop control of each of the AC output voltage and the AC output current may be performed to allow a negative feedback to be applied. The loop control allows, in the power conversion device 1, the AC output voltage e_uw to be substantially equal to the command value e_uw* of the AC output voltage e_uw, and the AC output current i_inv to be substantially equal to the command value i_inv* of the AC output current i_inv. Further, in the power conversion device 1, the loop control of a voltage of the neutral point, i.e., the neutral line OL may be performed to allow a negative feedback to be applied. The loop control allows, in the power conversion device 1, the voltage of the neutral point to be controlled to maintain a balance of the voltage at the neutral point.

Description is given next of the bipolar PWM operation and the unipolar PWM operation by exemplifying the case where the DC/AC inverter 20 performs in the single-phase three-wire output mode MA. It is to be noted that the same holds true also for the single-phase two-wire output (U-O) mode MC and the single-phase two-wire output (W-O) mode MD.

Figure 7:
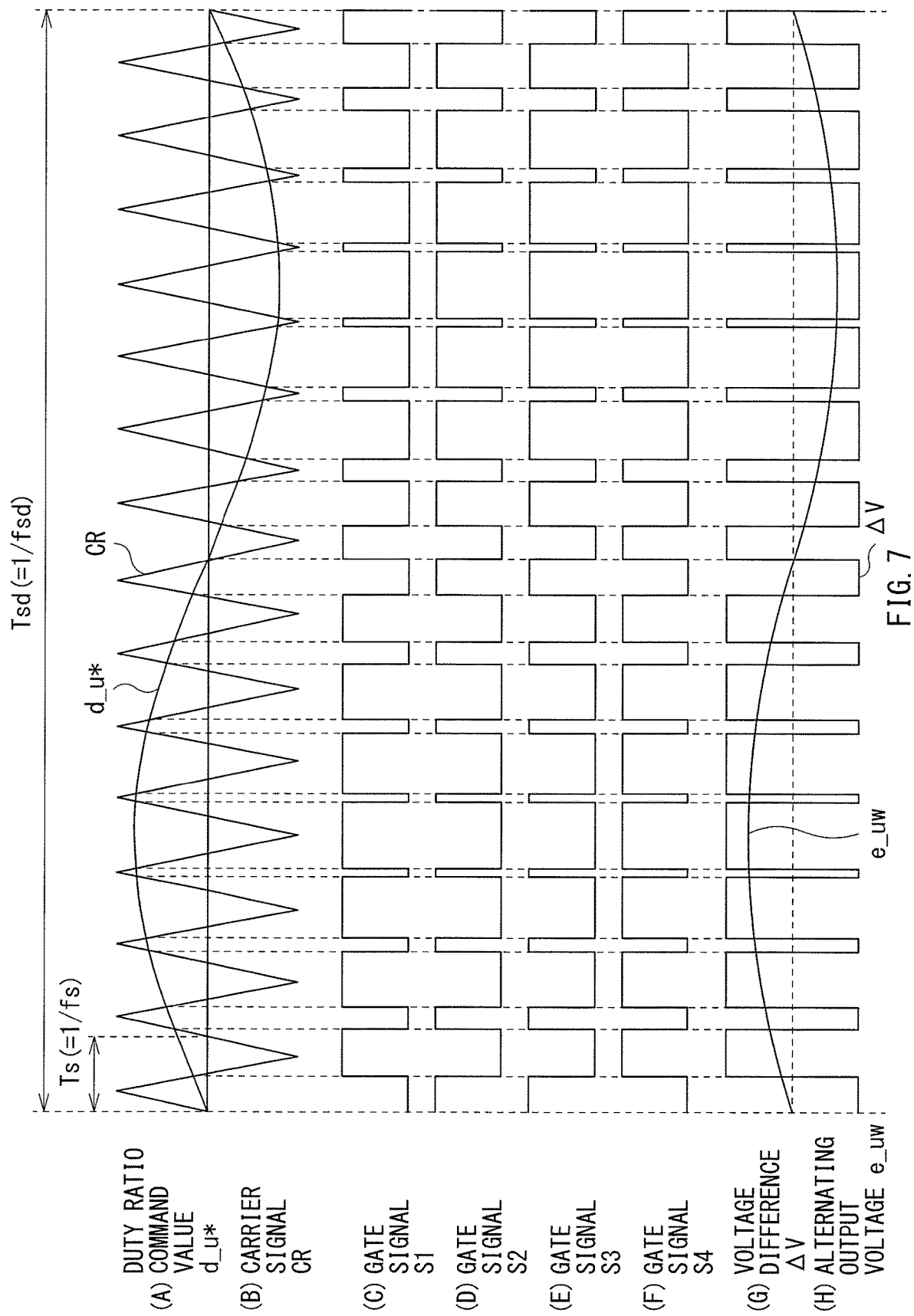
FIG. 7 is a timing waveform diagram illustrating an example of a bipolar PWM operation in the DC/AC inverter illustrated in FIG. 1.

FIG. 7 illustrates an example of respective waveforms of the gate signals S1 to S4 in a case where the DC/AC inverter 20 performs the bipolar PWM operation. (A) of FIG. 7 illustrates the duty ratio command value d_u*. (B) of FIG. 7 illustrates a waveform of a carrier signal CR. (C) to (F) of FIG. 7 illustrate the respective waveforms of the gate signals S1 to S4. (G) of FIG. 7 illustrates a waveform of a voltage difference ΔV between a voltage at the node N1 and a voltage at the node N2. (H) of FIG. 7 illustrates a waveform of the AC output voltage e_uw. In this example, in a case where the gate signal S1 is in a high level, the switching element SW1 may be brought into an ON state, whereas in a case where the gate signal S1 is in a low level, the switching element SW1 may be brought into an OFF state. The same holds true also for the gate signals S2 to S4. In this FIG. 7, a period of the cycle Ts is made longer for convenience of description; however, for example, the cycle Ts may be set to 50 μsec. (=1/20 kHz), and a cycle Tsd may be set to 16.7 msec. (=1/60 Hz).

In a case where the bipolar PWM operation is performed, the power supply controller 31 may set the parameter PWMSW to "1". This allows the gate signal generator 62 to be supplied with, as the command value d_w*, the duty ratio command value d_u* that is to be supplied to the gate signal generator 61.

The gate signal generator 61 may generate the carrier signal CR as illustrated in (B) of FIG. 7, and may generate the gate signals S1 and S2 as illustrated in (C) and (D) of FIG. 7 on the basis of the carrier signal CR and the duty ratio command value d_u*, illustrated in (A) of FIG. 7, supplied from the current controller 49. Likewise, the gate signal generator 62 may generate the carrier signal CR as illustrated in (B) of FIG. 7, and may generate the gate signals S3 and S4 as illustrated in (E) and (F) of FIG. 7 on the basis of the carrier signal CR and the duty ratio command value d_w*, i.e., the command value d_u*, illustrated in (A) of FIG. 7, supplied from the multiplier 50. A pulse width of each of the gate signals S1 to S4 may vary depending on the duty ratio command value d_u*. In the bipolar PWM operation, switching timings of the four switching elements SW1 to SW4 may be substantially simultaneous. Although not illustrated, a period when the gate signal S1 is in a high level and a period when the gate signal S2 is in a high level may be so set as to be apart from each other by dead time Td. The dead time Td is provided to prevent the high-voltage line HL and the low-voltage line LL from electrically short-circuiting each other. The same holds true also for the gate signals S3 and S4. The voltage difference ΔV between the voltage at the node N1 and the voltage at the node N2 may be a pulse signal corresponding to each of the gate signals S1 to S4, as illustrated in (G) of FIG. 7. The pulse signal may make transition between two voltages. The low-pass filters 29U and 29W each remove a high-frequency component included in the pulse signal. In this manner, the DC/AC inverter 20 may generate the AC output voltage e_uw, as illustrated in (H) of FIG. 7.

Figure 8:
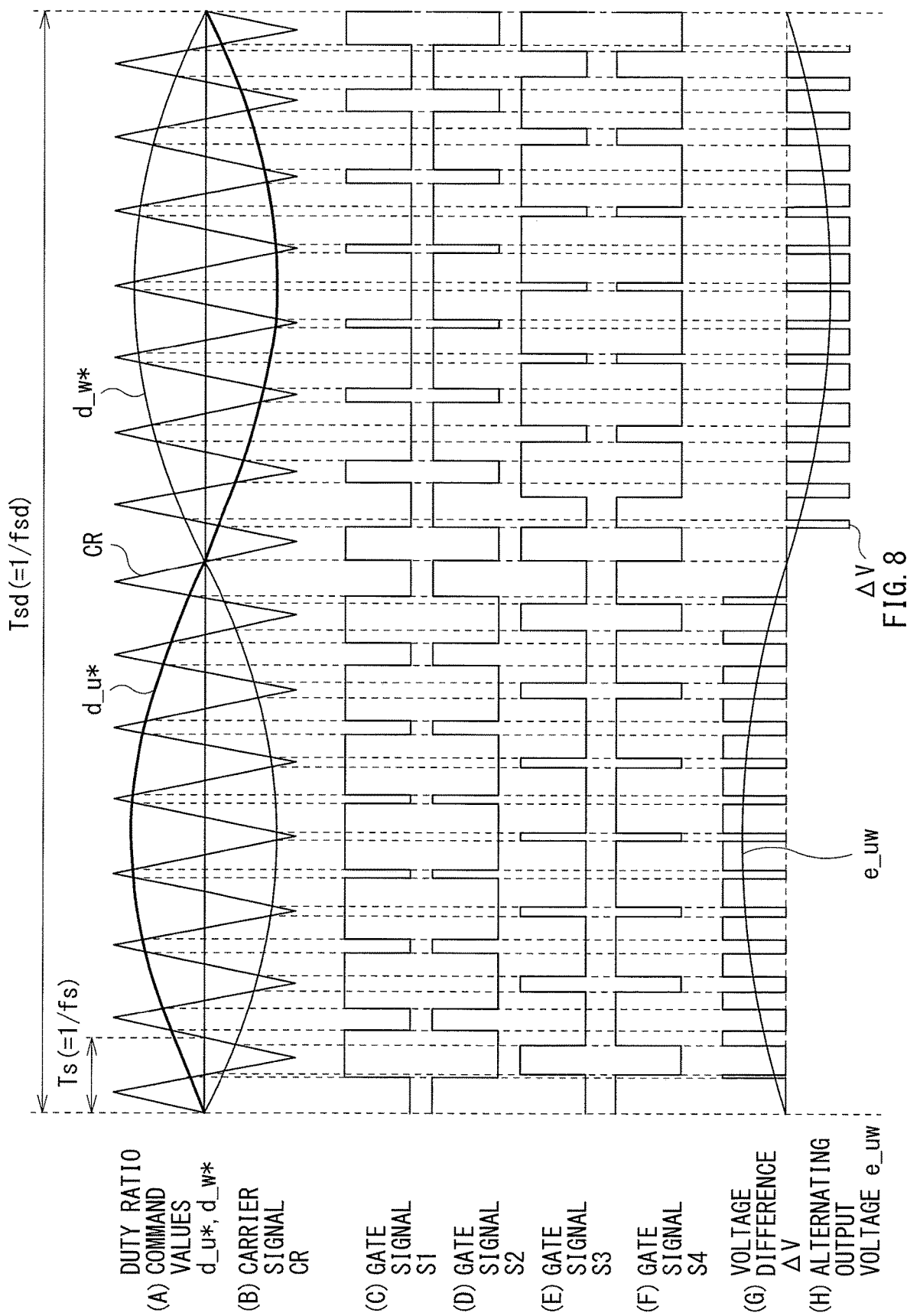
FIG. 8 is a timing waveform diagram illustrating an example of a unipolar PWM operation in the DC/AC inverter illustrated in FIG. 1.

FIG. 8 illustrates an example of respective waveforms of the gate signals S1 to S4 in a case where the DC/AC inverter 20 performs the unipolar PWM operation. (A) of FIG. 8 illustrates the duty ratio command values d_u* and d_w*. (B) of FIG. 8 illustrates a waveform of the carrier signal CR. (C) to (F) of FIG. 8 illustrate the respective waveforms of the gate signals S1 to S4. (G) of FIG. 8 illustrates a waveform of the voltage difference ΔV between the voltage at the node N1 and the voltage at the node N2. (H) of FIG. 8 illustrates a waveform of the AC output voltage e_uw.

In a case where the unipolar PWM operation is performed, the power supply controller 31 may set the parameter PWMSW to "−1". This allows the gate signal generator 62 to be supplied with, as the command value d_w*, a command value having reversed polarity of the duty ratio command value d_u* that is to be supplied to the gate signal generator 61.

The gate signal generator 61 may generate the carrier signal CR as illustrated in (B) of FIG. 8, and may generate the gate signals S1 and S2 as illustrated in (C) and (D) of FIG. 8 on the basis of the carrier signal CR and the duty ratio command value d_u*, illustrated in (A) of FIG. 8, supplied from the current controller 49. Likewise, the gate signal generator 62 may generate the carrier signal CR as illustrated in (B) of FIG. 8, and may generate the gate signals S3 and S4 as illustrated in (E) and (F) of FIG. 8 on the basis of the carrier signal CR and the duty ratio command value d_w*, illustrated in (A) of FIG. 8, supplied from the multiplier 50. Unlike the case of the bipolar PWM operation illustrated in FIG. 7, in the unipolar PWM operation, switching timings of the switching elements SW1 and SW2 and switching timings of the switching elements SW3 and SW4 may be different from one another. The voltage difference ΔV between the voltage at the node N1 and the voltage at the node N2 may be a pulse signal corresponding to each of the gate signals S1 to S4, as illustrated in (G) of FIG. 8. The pulse signal may make transition among three voltages. The pulse signal has a transition frequency that is twice the case of the bipolar PWM operation illustrated in FIG. 7. The low-pass filters 29U and 29W each remove a high-frequency component included in the pulse signal. In this manner, the DC/AC inverter 20 may generate the AC output voltage e_uw, as illustrated in (H) of FIG. 8.

The switching element SW1 corresponds to a specific but non-limiting example of a "first switching element" in one embodiment of the disclosure. The switching element SW2 corresponds to a specific but non-limiting example of a "second switching element" in one embodiment of the disclosure. The switching element SW3 corresponds to a specific but non-limiting example of a "third switching element" in one embodiment of the disclosure. The switching element SW4 corresponds to a specific but non-limiting example of a "fourth switching element" in one embodiment of the disclosure. The switching element SW5 corresponds to a specific but non-limiting example of a "fifth switching element" in one embodiment of the disclosure. The switching element SW6 corresponds to a specific but non-limiting example of a "sixth switching element" in one embodiment of the disclosure. The high-voltage line HL corresponds to a specific but non-limiting example of a "first voltage line" in one embodiment of the disclosure. The low-voltage line LL corresponds to a specific but non-limiting example of a "second voltage line" in one embodiment of the disclosure. The node N1 corresponds to a specific but non-limiting example of a "first node" in one embodiment of the disclosure. The node N2 corresponds to a specific but non-limiting example of a "second node" in one embodiment of the disclosure. The node N3 corresponds to a specific but non-limiting example of a "third node" in one embodiment of the disclosure. The terminal T31 corresponds to a specific but non-limiting example of a "first output terminal" in one embodiment of the disclosure. The terminal T32 corresponds to a specific but non-limiting example of a "second output terminal" in one embodiment of the disclosure. The terminal T33 corresponds to a specific but non-limiting example of a "third output terminal" in one embodiment of the disclosure. The low-pass filter 29U corresponds to a specific but non-limiting example of a "first low-pass filter" in one embodiment of the disclosure. The low-pass filter 29W corresponds to a specific but non-limiting example of a "second low-pass filter" in one embodiment of the disclosure. The switch Sstdu corresponds to a specific but non-limiting example of a "first switch" in one embodiment of the disclosure. The switch Sstdw corresponds to a specific but non-limiting example of a "second switch" in one embodiment of the disclosure. The control section 30 corresponds to a specific but non-limiting example of a "control section" in one embodiment of the disclosure. The duty ratio generation section 40 corresponds to a specific but non-limiting example of a "setting section" in one embodiment of the disclosure. The drive section 60 corresponds to a specific but non-limiting example of a "drive section" in one embodiment of the disclosure.

The voltage e_uo corresponds to a specific but non-limiting example of a "first voltage" in one embodiment of the disclosure. The voltage e_wo corresponds to a specific but non-limiting example of a "second voltage" in one embodiment of the disclosure. The command value e_uw* corresponds to a specific but non-limiting example of a "voltage command value" in one embodiment of the disclosure. The current i_inv1 corresponds to a specific but non-limiting example of a "first current" in one embodiment of the disclosure. The current i_inv2 corresponds to a specific but non-limiting example of a "second current" in one embodiment of the disclosure. The duty ratio command value d_u* corresponds to a specific but non-limiting example of a "first duty ratio" in one embodiment of the disclosure. The duty ratio command value d_w* corresponds to a specific but non-limiting example of a "second duty ratio" in one embodiment of the disclosure. The duty ratio command value d_o* corresponds to a specific but non-limiting example of a "third duty ratio" in one embodiment of the disclosure.

[Operations and Workings]

Description is given next of operations and workings of the power conversion device 1 of the present example embodiment.

[Outline of Overall Operation]

Description is given first of an outline of overall operations of the power conversion device 1 with reference to FIGS. 1 and 2.

As illustrated in FIG. 2, in the grid connected operation mode M1, the control section 30 may bring the switches Sgridu and Sgridw into an ON state, and may bring the switches Sstdu and Sstdw into an OFF state. This causes the commercial power source GRID to be coupled to the power conversion device 1 and the load device LOAD to be decoupled from the power conversion device 1. On the basis of an AC voltage supplied from the commercial power source GRID, the DC/AC inverter 20 may perform the constant-voltage control to allow the DC bus voltage Vdc to be a predetermined voltage, e.g., 400 V. In a specific but non-limiting example, the control section 30 may generate the gate signal S1 to S4 on the basis of the information about the system voltage e_grid supplied from the voltage detection section 19, for example. This causes the switching elements SW1 to SW4 to be turned ON and OFF on the basis of the gate signals S1 to S4, respectively, in synchronization with the AC voltage supplied from the commercial power source GRID. The switching elements SW5 and SW6 may maintain the OFF state, for example. This causes the DC/AC inverter 20 to perform the constant-voltage control to allow the DC bus voltage Vdc to be the predetermined voltage. The bidirectional DC/DC converter 10 may perform a charge-discharge power control on the battery BT.

As illustrated in FIG. 2, in the stand-alone operation mode M2, the control section 30 may bring the switches Sstdu and Sstdw into an ON state, and may bring the switches Sgridu and Sgridw into an OFF state. This causes the load device LOAD to be coupled to the power conversion device 1 and the commercial power source GRID to be decoupled from the power conversion device 1. On the basis of the battery voltage Vbt in the battery BT, the bidirectional DC/DC converter 10 may perform the constant-voltage control to allow the DC bus voltage Vdc to be a predetermined voltage, e.g., 400 V. The DC/AC inverter 20 may perform, for example, the constant-voltage-amplitude control to allow the voltage amplitude of the AC output voltage e_uw to be a predetermined amplitude. In a specific but non-limiting example, the control section 30 may generate the gate signals S1 to S6 on the basis of the following information. Non-limiting examples of the information may include the information about the DC bus voltage Vdc supplied from the voltage detection section 21, the information about the currents i_inv1 and i_inv2 supplied, respectively, from the current detection sections 23U and 23W, and the information about the voltages e_uo and e_wo supplied, respectively, from the voltage detection sections 26U and 26W. This causes the switching elements SW1 to SW6 to be turned ON and OFF on the basis of the gate signals S1 to S6, respectively. The DC/AC inverter 20 may turn ON and OFF the switching elements SW1 to SW4, for example, to thereby perform the constant-voltage-amplitude control to allow the voltage amplitude of the AC output voltage to be a predetermined amplitude. Further, the control section 30 may turn ON and OFF the switching elements SW5 and SW6 to thereby control a neutral point voltage e_o to maintain a balance of the voltage at the neutral point, i.e., the neutral line OL.

[Detailed Operation]

As illustrated in FIG. 3, in the stand-alone operation mode M2 the duty ratio command values d_u* and d_w* may be determined, for example, for each cycle Ts, e.g., 50 µsec. (=1/20 kHz) in the control section 30 on the basis of the currents i_inv1 and i_inv2, the voltages e_uo and e_wo, and the DC bus voltage Vdc. The gate signal generators 61 and 62 may generate the gate signals S1 to S4 on the basis of the command values d_u* and d_w*. The loop control allows, in the power conversion device 1, the AC output voltage e_uw to be substantially equal to the command value e_uw* of the AC output voltage e_uw, and the AC output current i_inv to be substantially equal to the command value i_inv* of the AC output current i_inv.

As illustrated in FIG. 3, the duty ratio command value d_o* may be determined, for example, for each cycle Ts, e.g., 50 µsec. (=1/20 kHz) in the control section 30 on the basis of the voltages e_uo and e_wo and the DC bus voltage Vdc. The gate signal generator 63 may generate the gate signals S5 and S6 on the basis of the command value d_o*. The loop control allows, in the power conversion device 1, the neutral point voltage e_o to be controlled to maintain a balance of the voltage at the neutral point, i.e., the neutral line OL.

The power supply controller 31 of the control section 30 may control the operation of the DC/AC inverter 20 to supply power to the load device LOAD on the basis of the voltages e_uo and e_wo and the currents i_inv1 and i_inv2. In a specific but non-limiting example, in a case where the power supply controller 31 detects that the U-phase load, e.g., the impedance Z1 in FIG. 1 is overloaded on the basis of the voltage e_uo and the current i_inv1, for example, the power supply controller 31 may stop the operation to supply power to the U-phase load. Further, in a case where the power supply controller 31 detects that the W-phase load, e.g., the impedance Z2 in FIG. 1 is overloaded on the basis of the voltage e_wo and the current i_inv2, the power supply controller 31 may stop the operation to supply power to the W-phase load, e.g., the impedance Z2 in FIG. 1.

Description is given below of operations and workings of the power conversion device 1 using several simulation results. In the following simulation, simulation conditions are set as illustrated in FIG. 9.

Description is given first of a case where the U-phase load, e.g., the impedance Z1 in FIG. 1 is in an overloaded state. For example, in a case where the DC/AC inverter 20 performs in the single-phase three-wire output mode MA, and where the power supply controller 31 determines that the U-phase load is in an overloaded state, the control mode may make transition from the single-phase three-wire output mode MA to the single-phase two-wire output (W-O) mode MD. When the overloaded state in the U-phase load is dissolved, the control mode may make transition from the single-phase two-wire output (W-O) mode MD to the single-phase three-wire output mode MA. This operation is described in detail below.

Figure 10:
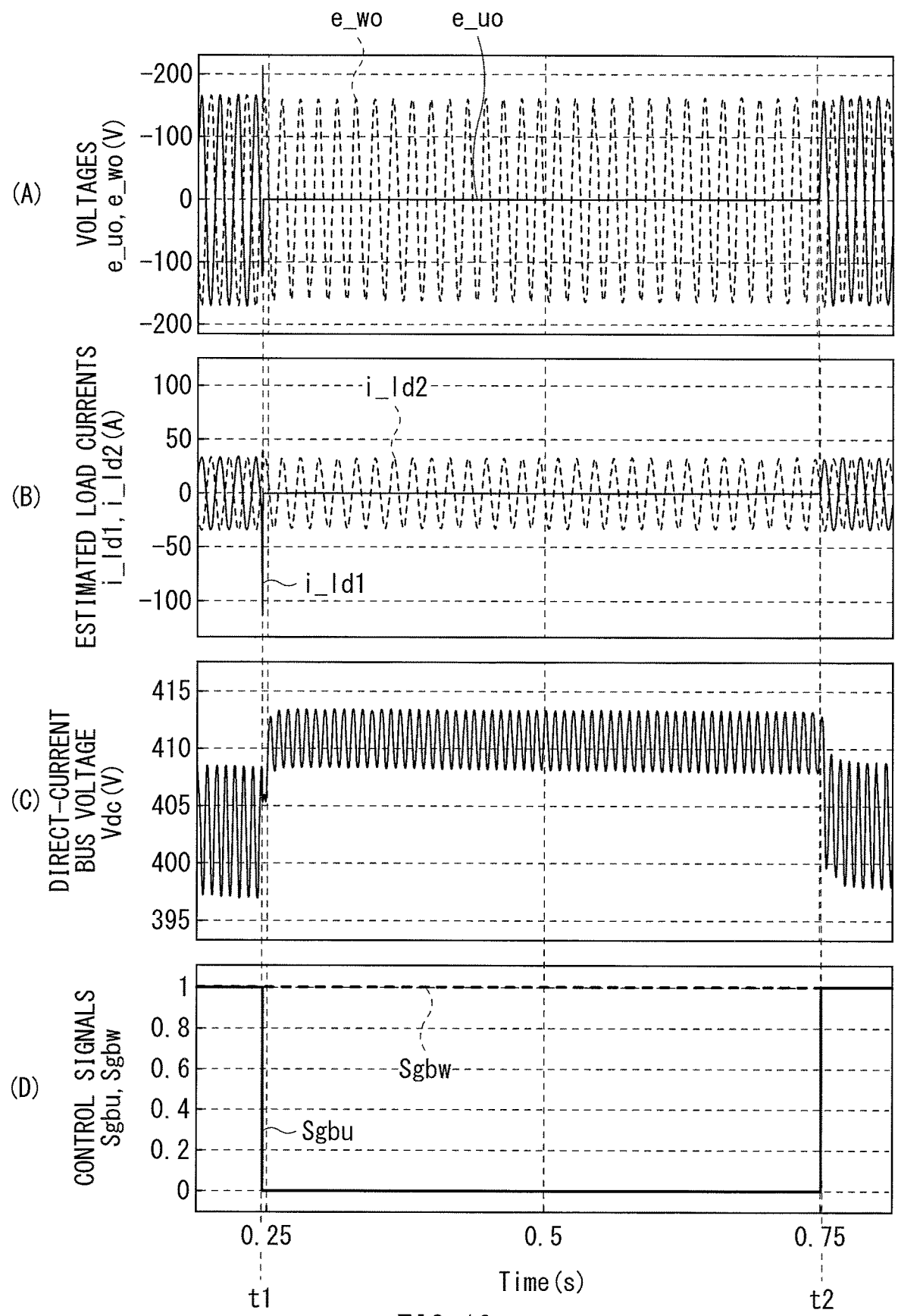
FIG. 10 is a timing waveform diagram illustrating an operation example of the power conversion device illustrated in FIG. 1.

FIG. 10 illustrates simulation results of the power conversion device 1 in the case where the U-phase load is in an overloaded state. (A) of FIG. 10 illustrates respective waveforms of the voltages e_uo and e_wo. (B) of FIG. 10 illustrates respective waveforms of the estimated load currents i_ld1 and i_ld2. (C) of FIG. 10 illustrates a waveform of the DC bus voltage Vdc. (D) of FIG. 10 illustrates respective waveforms of the control signals Sgbu and Sgbw.

In this example, in a period before timing t1, the DC/AC inverter 20 may perform in the single-phase three-wire output mode MA. In this example, at timing t1, an overcurrent may flow to the U-phase load to increase a current absolute value of the estimated load current i_ld1, as illustrated in (B) of FIG. 10. In this example, the power supply controller 31 may detect that the current absolute value of the current i_inv1 exceeds a predetermined current value to thereby determine that the U-phase load is in the overloaded state. Thereafter, the power supply controller 31 may cause the control mode to make transition from the single-phase three-wire output mode MA to the single-phase two-wire output (W-O) mode MD. This causes the power supply controller 31 to bring the switch Sstdu into an OFF state. The power supply controller 31 may cause the control signal Sgbu to make transition from "1" to "0" as illustrated in (D) of FIG. 10. This causes the gate signal generator 61 to set each of the gate signals S1 and S2 to the low level, i.e., "0" and the voltage e_uo to be substantially 0 V as illustrated in (A) of FIG. 10. The power supply controller 31 may set the parameters a and b to "0" and "−1", respectively. The control section 30 may generate the duty ratio command values d_u*, d_w*, and d_o*. In the single-phase two-wire output (W-O) mode MD illustrated in FIG. 5D, the gate signal generator 62 may generate the gate signals S3 and S4 on the basis of the duty ratio command value d_w*. The power supply controller 31 may select the input terminal T1 in the switch SW0, thus causing the gate signal generator 63 to generate the gate signals S5 and S6 on the basis of the duty ratio command value d_u*. This allows the DC/AC inverter 20 to continue generating the voltage e_wo that is an AC output voltage, as illustrated in (A) of FIG. 10.

After elapse of a predetermined length of time from timing t1, the power supply controller 31 may cause the control mode to make transition from the single-phase two-wire output (W-O) mode MD to the single-phase three-wire output mode MA. In this example, the overloaded state in the U-phase load has been dissolved before timing t2, and the power supply controller 31 may cause the control mode to make transition from the single-phase two-wire output (W-O) mode MD to the single-phase three-wire output mode MA at timing t2 that is near the zero-cross timing. This causes the power supply controller 31 to bring the switch Sstdu into an ON state. The power supply controller 31 may cause the control signal Sgbu to make transition from "0" to "1" as illustrated in (D) of FIG. 10. The power supply controller 31 may set the parameters a and b to "1" and "1", respectively. The control section 30 may generate the duty ratio command values d_u* and d_w*. In the single-phase three-wire output mode MA illustrated in FIG. 5A, the gate signal generator 61 may generate the gate signals S1 and S2 on the basis of the duty ratio command value d_u*. The gate signal generator 62 may generate the gate signals S3 and S4 on the basis of the duty ratio command value d_w*. The power supply controller 31 may select the input terminal T0 in the switch SW0, thus causing the gate signal generator 63 to generate the gate signals S5 and S6 on the basis of the duty ratio command value d_o*. This allows the DC/AC inverter 20 to continue generating the voltage e_wo and to resume generation of the voltage e_uo that is an AC output voltage, as illustrated in (A) of FIG. 10.

Description is given next of a case, for example, where the W-phase load, e.g., the impedance Z2 in FIG. 1 is in an overloaded state. For example, in a case where the DC/AC inverter 20 performs in the single-phase three-wire output mode MA, and where the power supply controller 31 determines that the W-phase load is in an overloaded state, the control mode may make transition from the single-phase three-wire output mode MA to the single-phase two-wire output (U-O) mode MC. When the overloaded state in the W-phase load is dissolved, the control mode may make transition from the single-phase two-wire output (U-O) mode MC to the single-phase three-wire output mode MA. This operation is described in detail below.

Figure 11:
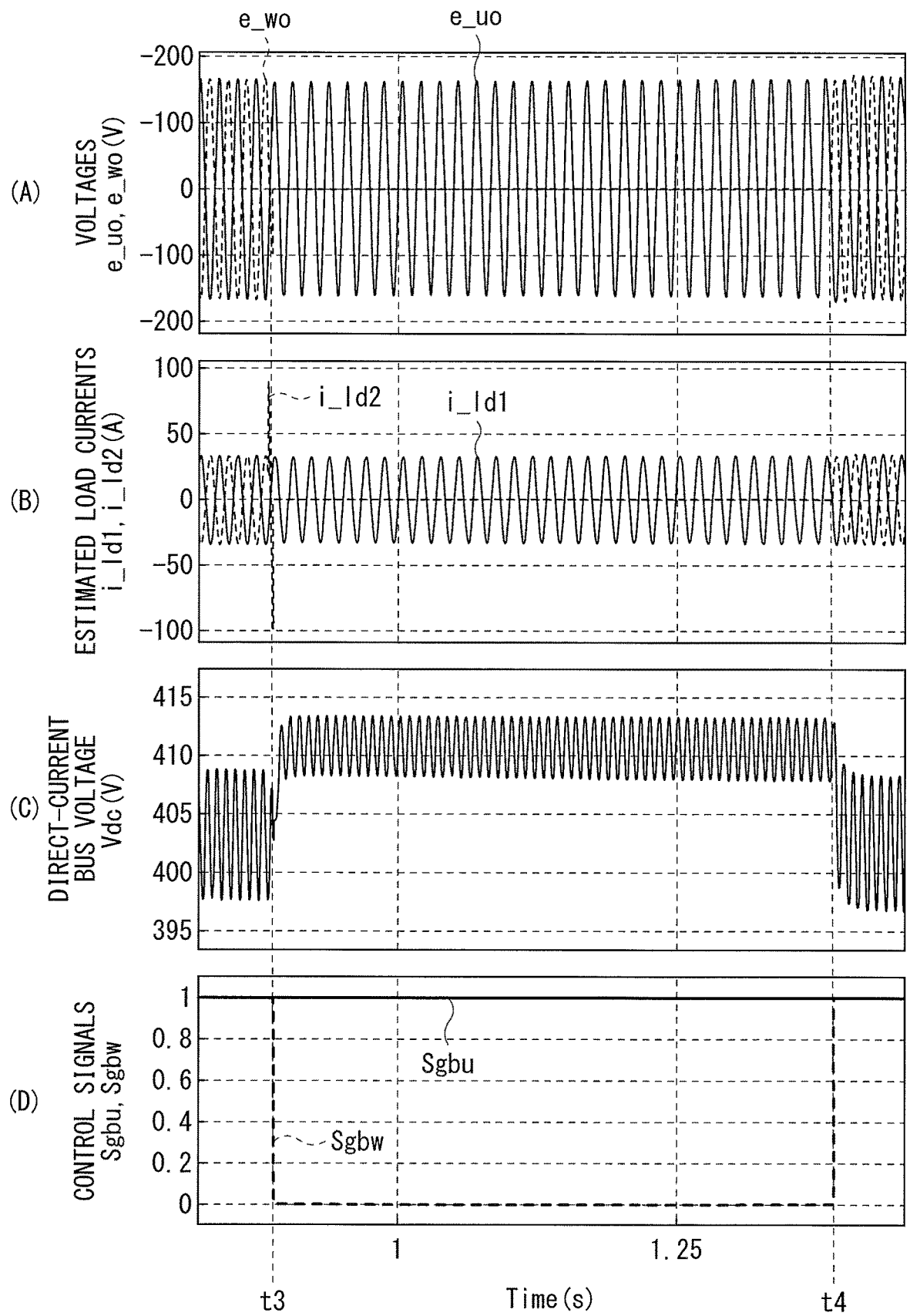
FIG. 11 is a timing waveform diagram illustrating another operation example of the power conversion device illustrated in FIG. 1.

FIG. 11 illustrates simulation results of the power conversion device 1 in the case where the W-phase load is in an overloaded state. (A) of FIG. 11 illustrates respective waveforms of the voltages e_uo and e_wo. (B) of FIG. 11 illustrates respective waveforms of the estimated load currents i_ld1 and i_ld2. (C) of FIG. 11 illustrate a waveform of the DC bus voltage Vdc. (D) of FIG. 11 illustrates respective waveforms of the control signals Sgbu and Sgbw.

In this example, in a period before timing t3, the DC/AC inverter 20 may perform in the single-phase three-wire output mode MA. In this example, at timing t3, an overcurrent may flow to the W-phase load to increase a current absolute value of the estimated load current i_ld2, as illustrated in (B) of FIG. 11. In this example, the power supply controller 31 may detect that the current absolute value of the current i_inv2 exceeds a predetermined current value to thereby determine that the W-phase load is in the overloaded state. Thereafter, the power supply controller 31 may cause the control mode to make transition from the single-phase three-wire output mode MA to the single-phase two-wire output (U-O) mode MC. This causes the power supply controller 31 to bring the switch Sstdw into an OFF state. The power supply controller 31 may cause the control signal Sgbw to make transition from "1" to "0" as illustrated in (D) of FIG. 11. This causes the gate signal generator 62 to set each of the gate signals S3 and S4 to the low level, i.e., "0" and the voltage e_wo to be substantially 0 V as illustrated in (A) of FIG. 11. The power supply controller 31 may set the parameters a and b to "1" and "0", respectively. The control section 30 may generate the duty ratio command values d_u*, d_w*, and d_o*. In the single-phase two-wire output (U-O) mode MC illustrated in FIG. 5C, the gate signal generator 61 may generate the gate signals S1 and S2 on the basis of the duty ratio command value d_u*. The power supply controller 31 may select the input terminal T2 in the switch SW0, thus causing the gate signal generator 63 to generate the gate signals S5 and S6 on the basis of the duty ratio command value d_w*. This allows the DC/AC inverter 20 to continue generating the voltage e_uo that is an AC output voltage, as illustrated in (A) of FIG. 11.

After elapse of a predetermined length of time from timing t3, the power supply controller 31 may cause the control mode to make transition from the single-phase two-wire output (U-O) mode MC to the single-phase three-wire output mode MA. In this example, the overloaded state in the W-phase load has been dissolved before timing t4, and the power supply controller 31 may cause the control mode to make transition from the single-phase two-wire output (U-O) mode MC to the single-phase three-wire output mode MA at timing t4 that is near the zero-cross timing. This causes the power supply controller 31 to bring the switch Sstdu into an ON state. The power supply controller 31 may cause the control signal Sgbw to make transition from "0" to "1" as illustrated in (D) of FIG. 11. The power supply controller 31 may set the parameters a and b to "1" and "1", respectively. The control section 30 may generate the duty ratio command values d_u* and d_w*. In the single-phase three-wire output mode MA illustrated in FIG. 5A, the gate signal generator 61 may generate the gate signals S1 and S2 on the basis of the duty ratio command value d_u*, and the gate signal generator 62 may generate the gate signals S3 and S4 on the basis of the duty ratio command value d_w*. The power supply controller 31 may select the input terminal T0 in the switch SW0, thus causing the gate signal generator 63 to generate the gate signals S5 and S6 on the basis of the duty ratio command value d_o*. This allows the DC/AC inverter 20 to continue generating the voltage e_uo and to resume generation of the voltage e_wo that is an AC output voltage, as illustrated in (A) of FIG. 11.

In this manner, it is possible for the power conversion device 1 to selectively bring one of paired switching elements SW1 and SW2 and paired switching elements SW3 and SW4 into an OFF state. In a specific but non-limiting example, in a case where the DC/AC inverter 20 operates in the single-phase three-wire output mode MA in the example of FIG. 10, and where the U-phase load is in the overloaded state, the control mode is caused to make transition from the single-phase three wire output mode MA to the single-phase two-wire output (W-O) mode MD. This brings the switching elements SW1 and SW2 into an OFF state and causes the switching elements SW3 to SW6 to continue operating. This makes it possible, for example, to stop power supply to the U-phase load and to continue power supply to the W-phase load. The same holds true also for a case, illustrated in FIG. 11, where the W-phase load is brought into the overloaded state. This enables the power conversion device 1 to properly perform and stop power supply.

That is, in a case where the U-phase load is in the overloaded state, bringing all of the switching elements SW1 to SW6 into an OFF state may result in stopping of power supply not only to the U-phase load in the overloaded state but also to the W-phase load in a normal state. This makes an electronic apparatus corresponding to the W-phase load unable to operate. In contrast, in the power conversion device 1, one of the paired switching elements SW1 and SW2 and the paired switching elements SW3 and SW4 is selectively brought into an OFF state, thus making it possible to stop power supply to the U-phase load and to continue power supply to the W-phase load, for example, when the U-phase load is brought into the overloaded state. This enables the power conversion device 1 to suppress the stopping of the operation to a minimum and thus to properly perform and stop power supply. As a result, it is possible for the power conversion device 1 to enhance robustness thereof.

It is possible for the power conversion device 1 to selectively bring one of the paired switching elements SW1 and SW2 and the paired switching elements SW3 and SW4 into an OFF state on the basis of the voltages e_uo and e_wo detected, respectively, by the voltage detection sections 26U and 26W and on the basis of the currents i_inv1 and i_inv2 detected, respectively, by the current detection sections 23U and 23W. This enables the power conversion device 1 to effectively detect the overloaded state in each of the U-phase load and the W-phase load on the basis of the voltages e_uo and e_wo and the currents i_inv1 and i_inv2. Thus, it becomes possible to properly perform and stop power supply.

In the power conversion device 1, when power supply to the U-phase load is stopped, selection of the input terminal T1 in the switch SW0 causes the switching elements SW3 and SW4 to be driven on the basis of the duty ratio command value d_w* and the switching elements SW5 and SW6 to be driven on the basis of the duty ratio command value d_u*, as illustrated in FIG. 5D. This makes it possible to continue power supply to the W-phase load. Likewise, when power supply to the W-phase load is stopped, selection of the input terminal T2 in the switch SW0 causes the switching elements SW1 and SW2 to be driven on the basis of the duty ratio command value d_u* and the switching elements SW5 and SW6 to be driven on the basis of the duty ratio command value d_w*, as illustrated in FIG. 5C. This makes it possible to continue power supply to the U-phase load. As a result, it is possible for the power conversion device 1 to properly perform and stop power supply.

In the power conversion device 1, when power supply to the U-phase load is stopped, the parameters a and b may be set to "0" and "−1", respectively, as illustrated in FIG. 5D. Thus, it becomes possible to properly determine the AC output voltage e_uw, the command value e_uw* of the AC output voltage, the AC output current i_inv, and the estimated load current i_ld, as indicated by Expressions EQ1. This makes it possible to continue power supply to the W-phase load. Likewise, when power supply to the W-phase load is stopped, the parameters a and b may be set to "1" and "0", respectively, as illustrated in FIG. 5C. Thus, it becomes possible to properly determine the AC output voltage e_uw, the command value e_uw* of the AC output voltage, the AC output current i_inv, and the estimated load current i_ld, as indicated by Expressions EQ1. This makes it possible to continue power supply to the U-phase load. As a result, it is possible for the power conversion device 1 to properly perform and stop power supply.

In the power conversion device 1, the control mode is caused to make transition from the single-phase two-wire output (W-O) mode MD to the single-phase three wire output mode MA at a timing that satisfies Expression EQ4. This makes it possible to start generation of the voltage e_uo from a timing near the so-called zero-cross timing and thus to start a stable operation in a short period of time. Likewise, in the power conversion device 1, the control mode is caused to make transition from the single-phase two-wire output (U-O) mode MC to the single-phase three wire output mode MA at a timing that satisfies Expression EQ4. This makes it possible to start generation of the voltage e_wo from a timing near the so-called zero-cross timing and thus to start a stable operation in a short period of time.

In a case where the bipolar PWM operation is performed, the multiplier 50 provided in the power conversion device 1 may supply the gate signal generator 62 with the duty ratio command value d_u* as the command value d_w*. In a case where the unipolar PWM operation is performed, the multiplier 50 may supply the gate signal generator 62 with a duty ratio having reversed polarity of the duty ratio command value d_u* as the command value d_w*. This makes it possible for the power conversion device 1 to properly perform and stop power supply in a case of performing either the unipolar PWM operation or the bipolar PWM operation.

In the power conversion device 1, the current estimator 44 of the control section 30 may estimate a current, i.e., the estimated current i_c1 flowing to the capacitor 25U and a current, i.e., the estimated current i_c2 flowing to the capacitor 25W on the basis of the voltages e_uo and e_wo, respectively, as indicated by Expressions EQ2. The estimated load current operator 47 may determine the estimated load current i_ld1 on the basis of the current i_inv1 and the estimated current i_c1 using the fourth expression of Expressions EQ1. Further, the estimated load current operator 47 may determine the estimated load current i_ld2 on the basis of the current i_inv2 and the estimated current i_c2 using the fifth expression of Expressions EQ1. As illustrated in FIG. 3, the control section 30 may control the operations of the switching elements SW1 to SW4 on the basis of the estimated load currents i_ld1 and i_ld2. In this manner, addition of the estimated currents i_c1 and i_c2 as disturbance components to the current control loop enables the power conversion device 1 to enhance responsiveness of the current control.

The estimation of the currents flowing to the capacitors 25U and 25W allows the power conversion device 1 to determine the estimated load currents i_ld1 and i_ld2. This makes it possible to omit, from the power conversion device 1, a current detection section that detects a load current and thus to make the device smaller.

The power conversion device 1 may be provided with the AC reactor 24U in paths from the node N1 to the terminals T21 and T31 and with the AC reactor 24W in paths from the node N2 to the terminals T22 and T32. Meanwhile, no AC reactor may be provided in a path from a coupling point, i.e., the node N3 between the emitter of the switching element SW5 and the collector of the switching element SW6 to the terminal T33. In other words, the terminal T33 and the coupling point, i.e., the node N3 between the emitter of the switching element SW5 and the collector of the switching element SW6 may be directly coupled together without using the AC reactor in between. This makes it possible to omit the AC reactor from the power conversion device 1 and thus to make the device smaller.

[Effects]

As described above, in the present example embodiment, selectively bringing one of the paired switching elements SW1 and SW2 and the paired switching elements SW3 and SW4 into an OFF state makes it possible to properly perform and stop power supply.

In the present example embodiment, providing no AC reactor in a path from the coupling point between the emitter of the switching element SW5 and the collector of the switching element SW6 to the terminal T33 enables the device to be smaller.

In the present example embodiment, in a case where the bipolar PWM operation is performed, the gate signal generator 62 may be supplied with the duty ratio command value d_u* as the command value d_w*, whereas in a case where the unipolar PWM operation is performed, the gate signal generator 62 may be supplied with a duty ratio having reversed polarity of the duty ratio command value d_u* as the command value d_w*. This makes it possible to properly perform and stop power supply in a case of performing either the unipolar PWM operation or the bipolar PWM operation.

MODIFICATION EXAMPLE 1

Although, in the foregoing example embodiment, no AC reactor is provided in a path from the coupling point, i.e., the node N3 between the emitter of the switching element SW5 and the collector of the switching element SW6 to the terminal T33, this is not limitative. In an alternative embodiment, an AC reactor may also be provided in the path from the coupling point, i.e., the node N3 between the emitter of the switching element SW5 and the collector of the switching element SW6 to the terminal T33, similarly to the paths from the node N1 to the terminals T21 and T31 and the paths from the node N2 to the terminals T22 and T32. In this case, the node N3 and the terminal T33 may be coupled to each other indirectly with the AC reactor in between.

MODIFICATION EXAMPLE 2

In the foregoing example embodiment, the power supply controller 31 may determine whether the U-phase load is in the overloaded state on the basis of the voltage e_uo and the current i_inv1 and may determine whether the W-phase load is in the overloaded state on the basis of the voltage e_wo and the current i_inv2. Various methods may be used for this determination method. Description is given below in detail of an example of the determination method.

Figure 12:
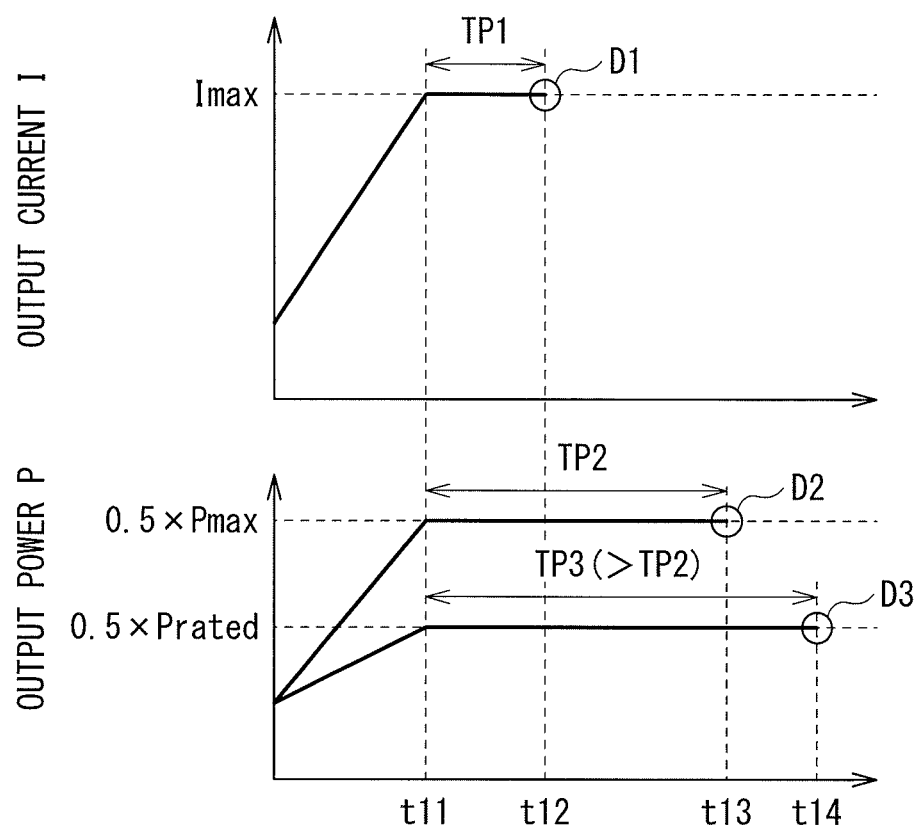
FIG. 12 describes an operation example of a power supply controller according to a modification example.

FIG. 12 illustrates an operation of detecting an overloaded state in a power supply controller 31A of a power conversion device 1A according to the present modification example. The power supply controller 31A may detect whether each of the U-phase load and the W-phase load is in an overloaded state. The overloaded state includes an overcurrent state and an overpower state. Description is given below of the operation of the power supply controller 31A by exemplifying an example of the U-phase load; however, the same holds true also for the W-phase load.

For example, the power supply controller 31A may detect whether the U-phase load is in the overcurrent state on the basis of the current i_inv1 and may detect whether the U-phase load is in the overpower state on the basis of the voltage e_uo and the current i_inv1. In a specific but non-limiting example, in a case where a value of an output current I, i.e., an absolute value of the current i_inv1 continues to be equal to or higher than a predetermined current value Imax over a predetermined period of time TP1, for example, the power supply controller 31A may determine that the U-phase load is in the overcurrent state (overcurrent determination D1). In a case where a value of an output power P (i.e., the voltage e_uo×the current i_inv1) continues to be equal to or higher than a predetermined output power value "0.5×Pmax" at a time of one-phase output over a predetermined period of time TP2, for example, the power supply controller 31A may determine that the U-phase load is in the overpower state (overpower determination D2). As used herein, the term "Pmax" is a predetermined output power value at a time of two-phase output. The output power value "0.5×Pmax" at the time of the one-phase output may be set larger than a rated output power "0.5×Prated" at the time of the one-phase output by a power difference ΔP. In a case where a value of the output power P (the voltage e_uo×the current i_inv1) continues to be equal to or higher than the rated output power "0.5×Prated" at the time of the one-phase output over a predetermined period of time TP3, for example, the power supply controller 31A may determine that the U-phase load is in the overpower state (overpower determination D3). The predetermined time TP3 may be set longer than the predetermined time TP2. This enables the power conversion device 1A to supply power to load devices that requires larger power upon activation than a steady state. Non-limiting examples of the load devices may include constant power load devices such as an electromagnetic cooker and motor load devices such as a feed pump. When determination of one of the overcurrent determination 1, the overpower determination 2, and the overpower determination 3 is performed for the U-phase load, the power supply controller 31A may determine that the U-phase load is in the overloaded state. The same holds true also for the W-phase load.

MODIFICATION EXAMPLE 3

Figure 13:
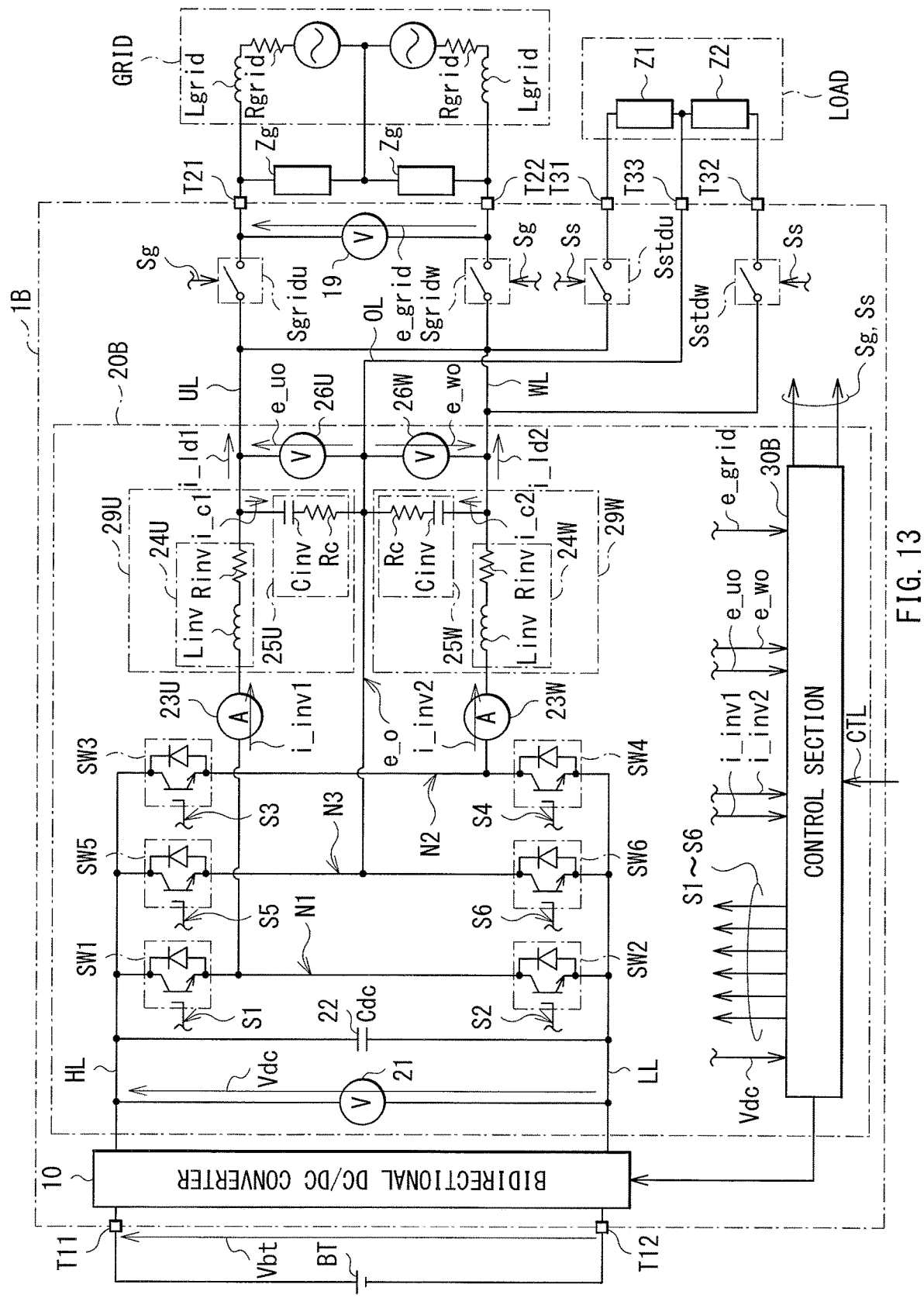
FIG. 13 is a circuit diagram illustrating a configuration example of a power conversion device according to another modification example.

Although, in the foregoing example embodiment, the power supply controller 31 of the control section 30 controls the operation of the DC/AC inverter 20 to supply power to the load device LOAD on the basis of the voltages e_uo and e_wo and the currents i_inv1 and i_inv2, this is not limitative. In an alternative embodiment, as in a power conversion device 1B illustrated in FIG. 13, for example, it may be also possible to control the operation of the DC/AC inverter to supply power to the load device LOAD on the basis of a control signal CTL supplied from the outside. The power conversion device 1B may include a DC/AC inverter 20B. The DC/AC inverter 20B may include a control section 30B. A power supply controller of the control section 30B may control an operation of the DC/AC inverter 20B to supply power to the load device LOAD on the basis of the voltages e_uo and e_wo, the currents i_inv1 and i_inv2, and the control signal CTL. In a specific but non-limiting example, for example, the control section 30B may stop or resume power supply to the U-phase load in accordance with operations of a user, on the basis of the control signal CTL supplied from an operation section that receives the operations of the user. Further, for example, the control section 30B may stop or resume the power supply to the U-phase load in accordance with an operation state of the load device LOAD, on the basis of the control signal CTL supplied from a detection section that detects the operation state of the load device LOAD.

The disclosure has been described hereinabove referring to the example embodiment and some modification examples. However, the disclosure is not limited to the example embodiment and modification examples, and may be modified in a variety of ways.

For example, although, in the foregoing example embodiment, the technology is applied to the power conversion device 1 that is operable in the two operating modes including the grid connected operation mode M1 and the stand-alone operation mode M2, this is not limitative. In an alternative embodiment, the technology may also be applied to a power conversion device that supplies power to a load device using a single-phase three wires, without having a function to perform the grid connected operation.

Moreover, the disclosure encompasses any possible combination of some or all of the various embodiments and the modification examples described herein and incorporated herein.

It is possible to achieve at least the following configurations from the above-described example embodiments of the disclosure.

(1)

A power conversion device including:

first paired switching elements including a first switching element and a second switching element, the first switching element being configured to couple a first voltage line to a first node, the second switching element being configured to couple a second voltage line to the first node;

second paired switching elements including a third switching element and a fourth switching element, the third switching element being configured to couple the first voltage line to a second node, the fourth switching element being configured to couple the second voltage line to the second node;

third paired switching elements including a fifth switching element and a sixth switching element, the fifth switching element being configured to couple the first voltage line to a third node, the sixth switching element being configured to couple the second voltage line to the third node;

a first output terminal;

a second output terminal;

a third output terminal coupled directly or indirectly to the third node;

a first low-pass filter provided in a first path between the first node and the first output terminal, the first low-pass filter being configured to remove a high-frequency component included in a voltage between the first node and the third node;

a second low-pass filter provided in a second path between the second node and the second output terminal, the second low-pass filter being configured to remove a high-frequency component included in a voltage between the second node and the third node; and a control section configured to selectively bring one of the first paired switching elements and the second paired switching elements into an OFF state.

(2)

The power conversion device according to (1), in which the control section brings the first paired switching elements into the OFF state in a case where determination is made that a first load device inserted between the first output terminal and the third output terminal is in an overloaded state, and the control section brings the second paired switching elements into the OFF state in a case where determination is made that a second load device inserted between the second output terminal and the third output terminal is in an overloaded state.

(3)

The power conversion device according to (1) or (2), in which the control section selectively brings one of the first paired switching elements and the second paired switching elements into the OFF state, on a basis of a first voltage outputted from the first low-pass filter, a second voltage outputted from the second low-pass filter, a first current flowing from the first node to the first low-pass filter, and a second current flowing from the second node to the second low-pass filter.

(4)

The power conversion device according to (1), in which the control section selectively brings one of the first paired switching elements and the second paired switching elements into the OFF state on a basis of a control signal supplied from an outside.

(5)

The power conversion device according to any one of (1) to (4), further including:

a first switch provided between the first low-pass filter and the first output terminal in the first path; and a second switch provided between the second low-pass filter and the second output terminal in the second path, in which the control section brings the first switch into an OFF state in a case where the first paired switching elements are brought into the OFF state, and the control section brings the second switch into an OFF state in a case where the second paired switching elements are brought into the OFF state.

(6)

The power conversion device according to any one of (1) to (5), in which the control section includes a setting section that sets a first duty ratio, a second duty ratio, and a third duty ratio, and a drive section that drives the first paired switching elements, the second paired switching elements, and the third paired switching elements on a basis of the first duty ratio, the second duty ratio, and the third duty ratio, respectively, in a case where the first paired switching elements, the second paired switching elements, and the third paired switching elements are operated, the drive section stopping driving the first paired switching elements, driving the second paired switching elements on the basis of the second duty ratio, and driving the third paired switching elements on the basis of the first duty ratio in the case where the first paired switching elements are brought into the OFF state, and the drive section driving the first paired switching elements on the basis of the first duty ratio, stopping driving the second paired switching elements, and driving the third paired switching elements on the basis of the second duty ratio in the case where the second paired switching elements are brought into the OFF state.

(7)

The power conversion device according to (6), in which
the setting section sets the first duty ratio and the second duty ratio on the basis of the first voltage outputted from the first low-pass filter, the second voltage outputted from the second low-pass filter, the first current flowing from the first node to the first low-pass filter, and the second current flowing from the second node to the second low-pass filter, in the case where the first paired switching elements, the second paired switching elements, and the third paired switching elements are operated, the setting section sets the first duty ratio and the second duty ratio on a basis of the second voltage and the second current in the case where the first paired switching elements are brought into the OFF state, and the setting section sets the first duty ratio and the second duty ratio on a basis of the first voltage and the first current in the case where the second paired switching elements are brought into the OFF state.

(8)

The power conversion device according to (6) or (7), in which the setting section generates a voltage command value of an AC output voltage, and sets the first duty ratio and the second duty ratio on a basis of the voltage command value, the setting section causes an amplitude of the voltage command value to be smaller in the case where the first paired switching elements are brought into the OFF state than in the case where the first paired switching elements, the second paired switching elements, and the third paired switching elements are operated, and the setting section causes an amplitude of the voltage command value to be smaller in the case where the second paired switching elements are brought into the OFF state than in the case where the first paired switching elements, the second paired switching elements, and the third paired switching elements are operated.

(9)

The power conversion device according to any one of (6) to (8), in which the first duty ratio and the second duty ratio are each in a range from −1 to 1, and the setting section selectively sets one of the first duty ratio and a duty ratio having reversed polarity of the first duty ratio, as the second duty ratio.

(10)

The power conversion device according to any one of (1) to (9), in which the control section performs a first operation and a second operation in order, the first operation bringing the first paired switching elements into the OFF state and operating the second paired switching elements, the second operation operating the first paired switching elements and the second paired switching elements, and the control section ends the first operation and starts the second operation at a timing when an absolute value of a voltage difference between the first voltage outputted from the first low-pass filter and the second voltage outputted from the second low-pass filter is smaller than a predetermined value.

According to the power conversion device of one embodiment of the disclosure, one of the first paired switching elements and the second paired switching elements is selectively brought into an OFF state, thus making it possible to properly perform and stop power supply.

Although the disclosure has been described in terms of exemplary embodiments, it is not limited thereto. It should be appreciated that variations may be made in the described embodiments by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" as used herein can allow for a degree of variability in a value or range. Moreover, no element or component in this disclosure is intended to be dedicated to the public regardless of whether the element or component is explicitly recited in the following claims.

What is claimed is:

1. A power conversion device comprising:

first paired switching elements including a first switching element and a second switching element, the first switching element being configured to couple a first voltage line to a first node, the second switching element being configured to couple a second voltage line to the first node;

second paired switching elements including a third switching element and a fourth switching element, the third switching element being configured to couple the first voltage line to a second node, the fourth switching element being configured to couple the second voltage line to the second node;

third paired switching elements including a fifth switching element and a sixth switching element, the fifth switching element being configured to couple the first voltage line to a third node, the sixth switching element being configured to couple the second voltage line to the third node;

a first output terminal;

a second output terminal;

a third output terminal coupled directly or indirectly to the third node;

a first low-pass filter provided in a first path between the first node and the first output terminal, the first low-pass filter being configured to remove a high-frequency component included in a voltage between the first node and the third node;

a second low-pass filter provided in a second path between the second node and the second output terminal, the second low-pass filter being configured to remove a high-frequency component included in a voltage between the second node and the third node; and a control section configured to selectively bring one of the first paired switching elements and the second paired switching elements into an OFF state, wherein the control section brings the first paired switching elements into the OFF state in a case where determination is made that a first load device inserted between the first output terminal and the third output terminal is in an overloaded state, and the control section brings the second paired switching elements into the OFF state in a case where determination is made that a second load device inserted between the second output terminal and the third output terminal is in an overloaded state.

2. The power conversion device according to claim 1, wherein the control section selectively brings one of the first paired switching elements and the second paired switching elements into the OFF state, on a basis of a first voltage outputted from the first low-pass filter, a second voltage outputted from the second low-pass filter, a first current flowing from the first node to the first low-pass filter, and a second current flowing from the second node to the second low-pass filter.

3. The power conversion device according to claim 1, further comprising:
a first switch provided between the first low-pass filter and the first output terminal in the first path; and
a second switch provided between the second low-pass filter and the second output terminal in the second path, wherein
the control section brings the first switch into an OFF state in a case where the first paired switching elements are brought into the OFF state, and
the control section brings the second switch into an OFF state in a case where the second paired switching elements are brought into the OFF state.

4. The power conversion device according to claim 1, wherein
the control section includes
a setting section that sets a first duty ratio, a second duty ratio, and a third duty ratio, and
a drive section that drives the first paired switching elements, the second paired switching elements, and the third paired switching elements on a basis of the first duty ratio, the second duty ratio, and the third duty ratio, respectively, in a case where the first paired switching elements, the second paired switching elements, and the third paired switching elements are operated,
the drive section stopping driving the first paired switching elements, driving the second paired switching elements on the basis of the second duty ratio, and driving the third paired switching elements on the basis of the first duty ratio in a case where the first paired switching elements are brought into the OFF state, and
the drive section driving the first paired switching elements on the basis of the first duty ratio, stopping driving the second paired switching elements, and driving the third paired switching elements on the basis of the second duty ratio in a case where the second paired switching elements are brought into the OFF state.

5. The power conversion device according to claim 4, wherein
the setting section sets the first duty ratio and the second duty ratio on a basis of a first voltage outputted from the first low-pass filter, a second voltage outputted from the second low-pass filter, a first current flowing from the first node to the first low-pass filter, and a second current flowing from the second node to the second low-pass filter, in the case where the first paired switching elements, the second paired switching elements, and the third paired switching elements are operated,
the setting section sets the first duty ratio and the second duty ratio on a basis of the second voltage and the second current in the case where the first paired switching elements are brought into the OFF state, and
the setting section sets the first duty ratio and the second duty ratio on a basis of the first voltage and the first current in the case where the second paired switching elements are brought into the OFF state.

6. The power conversion device according to claim 4, wherein
the setting section generates a voltage command value of an AC output voltage, and sets the first duty ratio and the second duty ratio on a basis of the voltage command value,
the setting section causes an amplitude of the voltage command value to be smaller in the case where the first paired switching elements are brought into the OFF state than in the case where the first paired switching elements, the second paired switching elements, and the third paired switching elements are operated, and
the setting section causes an amplitude of the voltage command value to be smaller in the case where the second paired switching elements are brought into the OFF state than in the case where the first paired switching elements, the second paired switching elements, and the third paired switching elements are operated.

7. The power conversion device according to claim 4, wherein
the first duty ratio and the second duty ratio are each in a range from −1 to 1, and
the setting section selectively sets one of the first duty ratio and a duty ratio having reversed polarity of the first duty ratio, as the second duty ratio.

8. The power conversion device according to claim 1, wherein
the control section performs a first operation and a second operation in order, the first operation bringing the first paired switching elements into the OFF state and operating the second paired switching elements, the second operation operating the first paired switching elements and the second paired switching elements, and
the control section ends the first operation and starts the second operation at a timing when an absolute value of a voltage difference between a first voltage outputted from the first low-pass filter and a second voltage outputted from the second low-pass filter is smaller than a predetermined value.

9. A power conversion device comprising:
first paired switching elements including a first switching element and a second switching element, the first switching element being configured to couple a first voltage line to a first node, the second switching element being configured to couple a second voltage line to the first node;
second paired switching elements including a third switching element and a fourth switching element, the third switching element being configured to couple the first voltage line to a second node, the fourth switching element being configured to couple the second voltage line to the second node;
third paired switching elements including a fifth switching element and a sixth switching element, the fifth switching element being configured to couple the first voltage line to a third node, the sixth switching element being configured to couple the second voltage line to the third node;
a first output terminal;
a second output terminal;
a third output terminal coupled directly or indirectly to the third node;

a first low-pass filter provided in a first path between the first node and the first output terminal, the first low-pass filter being configured to remove a high-frequency component included in a voltage between the first node and the third node;

a second low-pass filter provided in a second path between the second node and the second output terminal, the second low-pass filter being configured to remove a high-frequency component included in a voltage between the second node and the third node; and a control section configured to selectively bring one of the first paired switching elements and the second paired switching elements into an OFF state, wherein the control section selectively brings one of the first paired switching elements and the second paired switching elements into the OFF state, on a basis of a first voltage outputted from the first low-pass filter, a second voltage outputted from the second low-pass filter, a first current flowing from the first node to the first low-pass filter, and a second current flowing from the second node to the second low-pass filter.

10. The power conversion device according to claim 9, further comprising:

a first switch provided between the first low-pass filter and the first output terminal in the first path; and a second switch provided between the second low-pass filter and the second output terminal in the second path, wherein the control section brings the first switch into an OFF state in a case where the first paired switching elements are brought into the OFF state, and the control section brings the second switch into an OFF state in a case where the second paired switching elements are brought into the OFF state.

11. The power conversion device according to claim 9, wherein the control section includes a setting section that sets a first duty ratio, a second duty ratio, and a third duty ratio, and a drive section that drives the first paired switching elements, the second paired switching elements, and the third paired switching elements on a basis of the first duty ratio, the second duty ratio, and the third duty ratio, respectively, in a case where the first paired switching elements, the second paired switching elements, and the third paired switching elements are operated, the drive section stopping driving the first paired switching elements, driving the second paired switching elements on the basis of the second duty ratio, and driving the third paired switching elements on the basis of the first duty ratio in a case where the first paired switching elements are brought into the OFF state, and the drive section driving the first paired switching elements on the basis of the first duty ratio, stopping driving the second paired switching elements, and driving the third paired switching elements on the basis of the second duty ratio in a case where the second paired switching elements are brought into the OFF state.

12. The power conversion device according to claim 11, wherein the setting section sets the first duty ratio and the second duty ratio on a basis of a first voltage outputted from the first low-pass filter, a second voltage outputted from the second low-pass filter, a first current flowing from the first node to the first low-pass filter, and a second current flowing from the second node to the second low-pass filter, in the case where the first paired switching elements, the second paired switching elements, and the third paired switching elements are operated, the setting section sets the first duty ratio and the second duty ratio on a basis of the second voltage and the second current in the case where the first paired switching elements are brought into the OFF state, and the setting section sets the first duty ratio and the second duty ratio on a basis of the first voltage and the first current in the case where the second paired switching elements are brought into the OFF state.

13. The power conversion device according to claim 11, wherein the setting section generates a voltage command value of an AC output voltage, and sets the first duty ratio and the second duty ratio on a basis of the voltage command value, the setting section causes an amplitude of the voltage command value to be smaller in the case where the first paired switching elements are brought into the OFF state than in the case where the first paired switching elements, the second paired switching elements, and the third paired switching elements are operated, and the setting section causes an amplitude of the voltage command value to be smaller in the case where the second paired switching elements are brought into the OFF state than in the case where the first paired switching elements, the second paired switching elements, and the third paired switching elements are operated.

14. The power conversion device according to claim 11, wherein the first duty ratio and the second duty ratio are each in a range from −1 to 1, and the setting section selectively sets one of the first duty ratio and a duty ratio having reversed polarity of the first duty ratio, as the second duty ratio.

15. The power conversion device according to claim 9, wherein the control section performs a first operation and a second operation in order, the first operation bringing the first paired switching elements into the OFF state and operating the second paired switching elements, the second operation operating the first paired switching elements and the second paired switching elements, and the control section ends the first operation and starts the second operation at a timing when an absolute value of a voltage difference between a first voltage outputted from the first low-pass filter and a second voltage outputted from the second low-pass filter is smaller than a predetermined value.

16. A power conversion device comprising:

first paired switching elements including a first switching element and a second switching element, the first switching element being configured to couple a first voltage line to a first node, the second switching element being configured to couple a second voltage line to the first node;

second paired switching elements including a third switching element and a fourth switching element, the third switching element being configured to couple the first voltage line to a second node, the fourth switching element being configured to couple the second voltage line to the second node;

third paired switching elements including a fifth switching element and a sixth switching element, the fifth switching element being configured to couple the first voltage line to a third node, the sixth switching element being configured to couple the second voltage line to the third node;

a first output terminal;

a second output terminal;

a third output terminal coupled directly or indirectly to the third node;

a first low-pass filter provided in a first path between the first node and the first output terminal, the first low-pass filter being configured to remove a high-frequency component included in a voltage between the first node and the third node;

a second low-pass filter provided in a second path between the second node and the second output terminal, the second low-pass filter being configured to remove a high-frequency component included in a voltage between the second node and the third node;

a control section configured to selectively bring one of the first paired switching elements and the second paired switching elements into an OFF state; a first switch provided between the first low-pass filter and the first output terminal in the first path; and a second switch provided between the second low-pass filter and the second output terminal in the second path, wherein the control section brings the first switch into an OFF state in a case where the first paired switching elements are brought into the OFF state, and the control section brings the second switch into an OFF state in a case where the second paired switching elements are brought into the OFF state.

17. The power conversion device according to claim 16, wherein the control section selectively brings one of the first paired switching elements and the second paired switching elements into the OFF state on a basis of a control signal supplied from an outside.

18. The power conversion device according to claim 16, wherein the control section includes a setting section that sets a first duty ratio, a second duty ratio, and a third duty ratio, and a drive section that drives the first paired switching elements, the second paired switching elements, and the third paired switching elements on a basis of the first duty ratio, the second duty ratio, and the third duty ratio, respectively, in a case where the first paired switching elements, the second paired switching elements, and the third paired switching elements are operated, the drive section stopping driving the first paired switching elements, driving the second paired switching elements on the basis of the second duty ratio, and driving the third paired switching elements on the basis of the first duty ratio in a case where the first paired switching elements are brought into the OFF state, and the drive section driving the first paired switching elements on the basis of the first duty ratio, stopping driving the second paired switching elements, and driving the third paired switching elements on the basis of the second duty ratio in a case where the second paired switching elements are brought into the OFF state.

19. The power conversion device according to claim 18, wherein the setting section sets the first duty ratio and the second duty ratio on a basis of a first voltage outputted from the first low-pass filter, a second voltage outputted from the second low-pass filter, a first current flowing from the first node to the first low-pass filter, and a second current flowing from the second node to the second low-pass filter, in the case where the first paired switching elements, the second paired switching elements, and the third paired switching elements are operated, the setting section sets the first duty ratio and the second duty ratio on a basis of the second voltage and the second current in the case where the first paired switching elements are brought into the OFF state, and the setting section sets the first duty ratio and the second duty ratio on a basis of the first voltage and the first current in the case where the second paired switching elements are brought into the OFF state.

20. The power conversion device according to claim 18, wherein the setting section generates a voltage command value of an AC output voltage, and sets the first duty ratio and the second duty ratio on a basis of the voltage command value, the setting section causes an amplitude of the voltage command value to be smaller in the case where the first paired switching elements are brought into the OFF state than in the case where the first paired switching elements, the second paired switching elements, and the third paired switching elements are operated, and the setting section causes an amplitude of the voltage command value to be smaller in the case where the second paired switching elements are brought into the OFF state than in the case where the first paired switching elements, the second paired switching elements, and the third paired switching elements are operated.

* * * * *